US006381392B1

(12) United States Patent
Hayden et al.

(10) Patent No.: US 6,381,392 B1
(45) Date of Patent: Apr. 30, 2002

(54) ION EXCHANGE TECHNOLOGY FOR FABRICATION OF WAVEGUIDE SOURCE LASERS

(75) Inventors: Joseph S. Hayden, Clarks Summit, PA (US); David L. Veasey, Boulder, CO (US); David S. Funk, Boulder, CO (US); Norman A. Sanford, Boulder, CO (US); Sally Pucilowski, Luzerne, PA (US)

(73) Assignees: The United States of America as represented by the Secretary of Commerce, Washington, DC (US); The Regents of the University of Colorado

( * ) Notice: Subject to any disclaimer, the term of this patent is extended or adjusted under 35 U.S.C. 154(b) by 0 days.

(21) Appl. No.: 09/492,176

(22) Filed: Jan. 27, 2000

Related U.S. Application Data

(60) Provisional application No. 60/162,458, filed on Oct. 29, 1999, and provisional application No. 60/117,477, filed on Jan. 27, 1999.

(51) Int. Cl.[7] .................................................. G02B 6/10
(52) U.S. Cl. .......................... 385/132; 385/142; 372/39; 501/48
(58) Field of Search ..................... 385/132.142; 372/41, 372/39; 501/48

(56) References Cited

U.S. PATENT DOCUMENTS

| | | | |
|---|---|---|---|
| 4,962,067 A | 10/1990 | Myers | 501/45 |
| 5,080,503 A | 1/1992 | Najafi et al. | 385/1 |
| 5,334,559 A | 8/1994 | Hayden | 501/48 |
| 5,365,538 A | 11/1994 | Tumminelli et al. | 372/66 |
| 5,491,708 A | 2/1996 | Malone et al. | 372/41 |
| 5,526,369 A | 6/1996 | Hayden et al. | 372/40 |
| 5,663,972 A | 9/1997 | Payne et al. | 372/18 |
| 5,982,973 A | 11/1999 | Yan et al. | 385/141 |

FOREIGN PATENT DOCUMENTS

| | | |
|---|---|---|
| WO | WO 00/45478 | 8/2000 |
| WO | WO 00/51212 | 8/2000 |
| WO | WO 00/52791 | 9/2000 |

OTHER PUBLICATIONS

D.L. Veasey et al., *Applied Physics Letters*, vol. 74, No. 6, pp. 789–791 Feb., 1999.
D.L. Veasey et al., "Laser arrays may provide DWDM measurement tool", *Laser Focus World*, pp.
D.L. Veasey et al., "Rigorous scalar modeling of Er and Er/Yb–doped waveguide lasers," Photonics Laser Conference (1997) No month.
S. Bozorgui et al., "Chirped Grating DBR Lasers using Bent Waveguides", pp. 264–265.
*Electronics Letters*, vol. 27, No. 22, pp. 2073–2076 (Oct. 24, 1991).
*Electronics Letters*, vol. 27, No. 4, pp. 379–380 (Feb. 14, 1991).
*Electronics Letters*, vol. 28, No. 14, pp. 1321–1322 (Jul. 2, 1992).
S. Batchelor et al., *Electronics Letters*, vol. 32, No. 22, pp. 2082–2083 (1996).
J. Albert et al., *J. of Lightwave Tech.*, vol. 6, No. 4, pp. 552–563 (1988).

(List continued on next page.)

Primary Examiner—Ellen E. Kim
(74) Attorney, Agent, or Firm—Millen, White, Zelano & Branigan, P.C.

(57) ABSTRACT

The invention is directed to optical devices comprising a solid-state structured glass substrate having at least one waveguide incorporated therein, particularly waveguides and lasers incorporating such structure. The invention is also directed to methods for modifying such devices and their properties. The waveguides and lasers of the invention provide advantageous high power and increased slope efficiency and find use, for example, in telecommunications applications.

39 Claims, 2 Drawing Sheets

OTHER PUBLICATIONS

S. Iraj Najafi et al., *Journal of Lightwave Technology*, vol. LT–3, No. 4 pp. 763–766 (Aug. 1985).
R.K. Laguet al., *Applied Phys. Lett.* vol. 45, No. 2, pp. 117–118 (Jul. 1984).
Ramu V. Ramaswamy et al., *Journal of Quantum Electronics*, vol. 24, No. 5, pp. 780–786 (May 1988).
Pekka Ayras et al, *Applied Optics*, vol. 37, No. 36, pp. 8400–8405 (Dec. 1998).
Hui Gong et al. *Applied Optics*, vol. 36, No. 21, pp. 4954–4957.
J.F. Ryley et al., *Journal of Lightwave Technology*, vol. 10, No. 9, pp. 1230–1233 (Sep. 1992).
Y. Zhou et al., *IEE Proceedings–J*, vol. 139, No. 3, pp. 223–227 (Jun. 1992).
P.C. Noutsios et. al., *Electronics Letters*, vol. 28, No. 14, 1340–1342 (Jul. 1992).
R.V. Ramaswamy et al., *Journal of Lightwave Technology*, vol. 6, No. 6, pp. 984–1002 (Jun. 1988).
Christian Lester et. al., *Journal of Lightwave Technology*, vol. 13, No. 5, pp. 740–743 (May 1995).
J.A. Vallés et. al., *Journal of Quantum Electronics*, vol. 32, No. 9, pp. 1685–1694 (Sep. 1996).
F. Ladouceur et al., *IEE Proc.–Optoelectron*, vol. 141, No. 4, pp. 242–248 (Aug. 1994).
O. Lumholt et. al., *Electronics Letters*, vol. 29, No. 5, pp. 495–496 (Mar. 1993).
W,H. Loh et al., *Electronics Letters*, vol. 32, No. 13, pp. 1204–1205 (Jun. 1996).
K. Hattori et. al., *Electronics Letters*, vol. 30, No. 11, pp. 856–857 (May 1994).
H.J. Patrick et. al., *Electronics Letters*, vol. 33, No. 24 (Nov. 1997).
S.D. Dyer et al., *Electronics Letters*, vol. 34, No. 11 (May 1998).
A. Yeniay et. al., *IEEE Photonics Technology Letters*, vol. 9, No. 8, pp. 1099–1101 (Aug. 1997).
Phillip H. Howerton et. al., *Applied Optics*, vol. 30, No. 15, pp. 1911–1915 (May 1991).
Jesús Liñares et.al., *Applied Optics*, vol. 36, No. 27, pp. 6838–6842 (Sep. 1997).
M. J. Li et al., *Appl. Phys. Lett.*, vol. 58, No. 23, pp. 2607–2609 (Jun. 1991).
R.G. Walker et. al., *Applied Optics*, vol. 22, No. 12, pp. 1923–1936 (Jun. 1983).
W.J. Wang et all., *J. Appl. Phys.*, vol. 74, No. 3, pp. 1529–1533 (Aug. 1993).
Ole Lumholt et.al., *Journal of Lightwave Technology*, vol. 13, No. 2 pp. 275–282 (Feb. 1995).
Peter C. Noustics et. al., *IEEE Journal of Quantum Electronics*, vol. 27, No. 3, pp. 549–555 (Mar. 1991).
P.Camy et. al., *Electronics Letters*, vol. 32, No. 4 pp. 321–323 (Feb. 1996).
D. Kapila et. al., *Applied Optics*, vol. 34, No. 34 pp. 8011–8013 (Dec. 1995).
Véronique Francois et. al., *IEEE Photonics Technology Letters*, vol. 7, No. 8, pp. 872–874 (Aug. 1995).
Blagoy Pantchev et.al., *J. Appl. Phys.*, vol. 36, No. 7A, pp. 4320–4322 (Jul. 1997).
H.–J. Lilienhof et. al., *Optics Communications*, vol. 35, No. 1, pp. 49–53 (Oct. 1980).
H. Zhenguang et. al., *Appl. Phys. Lett.*, vol. 53, No. 31, pp. 1681–1683 (Oct. 1988).

Hans–J. Lilienhof et. al., *IEEE Journal of Quantum Electronics*, vol. QE–18, No. 11 (Nov. 1982).
Katherine Forrest et al., *Journal of Lightwave Technology*, vol. LT–4, No. 2 (Feb. 1986).
Ramu V. Ramaswamy et al., *Applied Optics*, vol. 27, No. 9 (May 1968).
H. Suche et. al., *Intergrated Optical Soiton Source*, pp. 1642–1646 (1997).
M.V.D. Vermelho et. al., *University of Glasgow–Department of Electronics and Electrical Engineering*, vol. 13 pp. 13/1–13/6 (1998).
A.M.J. Koonen et. al., *ECOC*, pp. 3.19–3.25 (1996).
P. Camy et. al., *ECOC*, pp. Th.L.3.6 (1995).
*Electronics Letters*, vol. 27, No. 15, pp. 1319–1320 Jul. (1991).
*Electronics Letters*, vol. 27, No. 15, pp. 1360–1361 (Jul. 1991).
*Electronics Letters*, vol. 28, No. 8, pp. 746–747 (Apr. 1992).
Janet Lehr Jackel et. al., *OFC'97 Technical Digest*, p. 84 (1997).
V.J. Mazurczyk et. al., *OFC'97 Technical Digest*, p. 85 (1997).
Ramakant Srivastava et al., *SPIE Intergrated Optical Circuits*, pp. 2–13 (1991).
*Electronics Letters*, vol. 24, No. 20, pp. 1258–1259 (1988).
*Electronics Letters*, vol. 27, No. 23, pp. 2167–2168 (1991).
D. Barbier et. al., *ECOC Conference Publication*, No. 448, pp. 41–44 (1997).
J.E. Roman, *Appl. Phys. Lett.*, vol. 61, No. 23 pp. 274–4–2746 (Dec. 1992).
D. Kapila et. al., *Applied Optics*, vol. 34, No. 34 pp. 8011–8012 (Dec. 1995).
D. Babier et. al., *IEEE Photonics Technology Letters*, vol. 9, No. 3 pp. 315–317 (Mar. 1997).
W.J. Wang et. al., *Electronics Letters*, vol. 28, No. 20 pp. 1872–1873 (Sep. 1992).
G. Nykolak et. al., *IEEE Photonics Technology Letters*, vol. 5, No. 10, pp. 1185–1187 (Oct. 1993).
J. Shmulovich et. al., *Electronics Letters*, vol. 28, No. 13, pp. 1181–1182 (Jun. 1992).
J. Shmulovich et. al., *AT & T Laboratories*, vol. 75–78, pp. PD18–1– PD18–4 (Feb. 1993).
Ruby N. Ghosh et. al., *IEEE Photonics Technology Letters*, vol. 8, No. 4, pp. 518–520 (Apr. 1996).
Serge M. Melle et. al., *IEEE Phtonocis Technology Letters*, vol. 5, No. 2 pp. 263–266 (Feb. 1993).
Fabian Strong, *IEEE*, pp. 306–310 (1998).
J.J. Pan et. al., *IEEE*, pp. 751–754 (1997).
Vijaysekhar Jayaraman et. al., *IEEE Journal of Quantum Electronics*, vol. 29, No. 6, pp. 1824–1834 (Jun. 1993).
Louay Eldada et. al., *IEEE Photonics Technology Letters*, vol. 11, No. 4, pp. 448–450 (Apr. 1999).
Kuninori Hattori et. al., *IEEE Photonics Technology Letters*, vol. 3, No. 10, pp. 882–884 (Oct. 1991).
Kevin Hsu et. al., *ECOC*, vol. 97, No. 448, (1987).
G. Raybon et. al., *Electronics Letters*, vol. 31, No. 14, pp. 1146–1147 (Jul. 1995).
Manabu Oguma et. al., *IEEE Photonics Technology Letters*, vol. 6, No. 5 pp. 586–587(May 1994).
G.W. Yoffe et al., *Electronics Letters*, vol. 34, No. 17, pp. 1688–1690 (Aug. 1998).
J.–M.P Delavaux et. al., *IEEE Photonics Technology Letters*, vol. 9, No. 2 pp. 247–249 (Feb. 1997).

Eustace K. Mwarania et.al, *Journal of Lightwave Technology*, vol. 11, No. 10 pp. 1550–1558 (Oct. 1993).
S. Iraj Najafi et. al., *Optical Society of America*, vol. 13, No. 49 pp. 308 (1998).
A. Miliou et al. , *IEEE Journal of Quantum Electronics*, vol. 25, No. 8, pp. 1889–1897 (1989).
G.S. Agapiou et al. *Optical and Quantum Electronics*, vol. 27, pp. 43–48 (1995).
M. Krishnaswamy et al., *Optical Materials*, vol. 6, pp. 287–292 (1996).
Y. Kimura et al., *Electronics Letters*, vol. 28, No. 15, pp. 1420–1422 (1992).
G.H. Charter et al., *Thin Solid Films*, vol. 87 pp. 285–292 (1982).
R.D. Stulz et al., *Appl. Phys. Lett.* , vol. 65, No. 24, pp. 3153 (1994).
Jian–jun Zheng et al., *Applied Physics Letters*, vol. 72, No. 15, pp. 1808–1810 (1998).
J. Amin et al., *SPIE*, vol. 2996, pp. 135–142 (1997).
Min–Yong Jeon et al., *IEEE Photonics Technology Letters*, vol. 8, No. 12, (1996).
Franck Delorme, *IEEE Journal of Quantum Electronics*, vol. 34 , No. 9 ( 1998).
M.W. Maeda, et al., *IEEE Photonics Technology Letters*, vol. 2, No. 11, (1990).
J.J. Pan, *IEEE*, pp. 015–020 ( 1993).
Y.Z. Xu, *IEEE Photonics Technology Letters*, vol. 10, No. 3, (1998).
Yew Tai Cheng, *IEE Photonics Technology Letters*, vol. 7, No. 5, pp. 485–487 (1995).
R.L. Shubochkin, *IEE Photonics Technology Letters*, vol. 10, No. 7, pp. 944–945 (1998).
Hiroshi Yasaka et al., *IEEE Photonics Technology Letters*, vol. 8, No. 6 pp. 764–766 (1996).
Kevin Hsu et al., *Journal of Lightwave Technology*, vol. 15, No. 8, pp. 1438–1441 (1997).
Serge M. Melle et al., *IEEE Photonics Technology Letters*, vol. 5, No. 2, pp. 263–266 (1993).
G.A. Ball et al., *Journal of Lightwave Technology*, vol. 12, No. 4 (1994).
L.R. Chen et al., *CLEO '97*, pp. 108–109 (1997).
P. Torres et al., *Journal of Lightwave Technology*, vol. 15, No. 3 (1997).
M.V.D. Vermelho et. al, *University of Glasgow–Dept. of Electrical Engineering*, pp. 13/1–13/6 (1998).
Anders Bjarkley et al., *IEEE*, pp. 317–322 (1997).
Christian Lester et. al, *Journal of Lightwave Technology*, vol. 13, No. 15 pp. 740–743, (1995).
D. Barbier et al., *IEEE Photonics Technology Letters*, vol.. 9, No. 3 pp. 315–317 (1997).
Marco Federighi et al., *IEEE*, pp. 85–86 (1998).
D. Barbier et al., *OFC '98 Technical Digest*, pp. 45–46 (1998).
P. Fournier et al., *Electronics Letters*, vol. 33, No. 4, pp. 293–295 (1997).
W.J. Wang et al., *Electronic Letters*, vol. 28, No. 20, pp. 1872–1873 (1992).
Kuninori Hattori, *IEEE*, pp. 308–309 (1997).
A. Yeniay et al., *IEEE Photonics Technology Letters*, vol. 9, No. 8, pp. 1099–1101 (1997).
J. Sochtig et al., *Electronics Letters*, vol. 32, No. 10, pp. 899–900 (1996).
S. Bozorgui et al., *Ecole Superieure d'Electricite*, pp. 264–265.

J.F. Ryley et al., *Journal of Lightwave Technology*, vol. 10 No. 9, pp. 1230–1233 (1992).
Eric M. Bradley et al., *Journal of Lightwave Technology*, vol. 15, No. 7, pp. 1156–1164( 1997).
D. Barbier et al., *ECOC 97*, vol. 22–25, No. 448, pp. 41–44 (1997).
M.A. Forstiere et al., *IEEE*, pp. 795–799 (1995).
C. Montero et al., *Optics Letters*, vol. 24, No. 21, pp. 1487–1489 (1999).
C.T.A. Brown et al, *Appl. Phys. Lett.*, vol. 71, No. 9, pp. 1139–1141 ( 1997).
Kevin Hsu et al., *Optics Letters*, vol. 20, No. 4, pp. 377–379 (1995).
P.R. Morkel et al., *IEEE Journal of Quantum Electronics*, vol. 29, No. 7, pp. 2178–2188 ( 1993).
Toru Mizunami et al., *Appl. Phys.*, vol. 36, No. 12A, pp. 7207–7211 (1997).
David L. Veasey et al., *IEEE Journal of Quantum Electronics*, vol. 33, No. 10 pp. 1–16 (1997).
A. Gloag et al., *Appl. Phys. Lett.*, vol. 66, No. 24, pp. 3263–3265 (1995).
G.P. Lees et al., *Electronics Letters*, vol. 32, No. 14, (1996).
Lifeng Li et al., *SPIE*, vol. 835, (1987).
B. Boulard et al., *Electonics Letters*, vol. 34, No. 3, (1998).
N.A. Sanford et al., *Optics Letters*, vol. 16, No. 14, pp. 1095–1097 (1991).
*Electronics Letters*, vol. 24, No. 18 (1988).
Ralf Brinkmann et al., *IEEE Journal of Quantum Electronics*, vol. 30, No. 10 pp. 2356–2360 (1994).
Eric Lalier, *Applied Optics*, vol. 31, No. 25, pp. 5276–5282 (1992).
Yoshinori Hibino et al., *IEEE Photonics Technology Letters*, vol. 1, No. 11, pp. 349–350 ( 1989).
Kevin J. Malone, *SPIE Critical Review*, (1994).
A. Yeniay et al., *ECOC '97*, vol. 22–25, No. 448, pp. 53–56 (1997).
Edwin Snocks et al., *IEEE Journal of Quantum Electronics*, vol. 32, No. 9, pp. 1680–1684 (1996).
Choon Kun Ryu et al., *Appl. Phys. Lett.*, vol. 66, No. 19, pp. 2496–2498 (1995).
M. Benatsou et al., *Appl. Phys. Lett.*, vol. 71, No. 4, pp. 428–430 (1997).
R. Serna et al., *Journal of Applied Physics*, vol. 84, No. 4, pp. 2352–2354 (1998).
S. Guldberg et al *Electronics Letters*, vol. 35, No. 4, ( 1999).
G.N. van den Hoven et al., *Appl. Phys. Lett.*, vol. 68, No. 14, pp. 1886–1888 (1996).
Y.C. Yan et al., *Appl. Phys. Lett.*, vol. 71, No. 20, pp. 2922–2924 (1997).
G.L. Vossler et al., *Electronic Letters*, vol. 31, No. 14, pp. 116 (1995).
P. Fournier et al., *Electronics Letters*, vol. 33, No. 4, (1997).
T. Feucher et al., *IEEE Phontonics Technology Letters*, vol. 4, No. 6, pp. 542–544 (1992).
W.H. Loh et al., *Appl. Phys. Lett.*, vol. 69, No. 15, pp. 2151–2153 (1996).
N.A. Sanford et al., *Optics Letters*, vol. 16, No. 15, pp. 1168–1170 (1991).
Hiroshi Aoki et al., *IEEE Photonics Technology Letters*, vol. 2, No. 7 pp. 459–460 (1990).
Charles J. Koester et al., *Applied Optics*, vol. 3, No. 10, pp. 1182–1186 (1964).
J. Stone et al., *Applied Optics*, vol. 13, No. 6, pp. 1256–1257 (1974).

F. Hakimi et al., *Optics Letters*, vol. 14, No. 19, pp. 1060–1061 (1989).

H. Aoki et al., *Electronics Letters*, vol. 26, No. 22, pp. 1908–1911 (1990).

Mahmoud M. Abouelleil et al., *Optics Letters*, vol. 16, No. 24, pp. 1949–1951 (1991).

D. Babier et al., *ECOC '96*, pp. 3.161–3.6.

T. Feuchter et al., *IEEE Photonics Technology Letters*, vol. 4, No. 6, pp. 542–544 (1992).

J.R. Bonar et al., *Electronics Letters*, vol. 30, No. 3, pp. 29–230 (1994).

T. Kitagawa et al., *Electronics Letters*, vol. 27, No. 4, pp. 354–355 (1991).

Yasutake Ohishi et al., *Journal of Lightwave Technology*, vol. LT–2, No. 5, pp. 593–596 (1984).

E.K. Mwarania et al., *IEEE Photonics Technology Letters*, vol. 4, No. 3, pp. 235–237 (1992).

J.E. Roman et al., *Electronics Letters*, vol. 31, No. 16, pp. 1345–1346 (1995).

P. Camy et al., *Electronics Letters*, vol. 32, No. 4, pp. 321–323 (1996).

M. Hempstead et al., *IEE*, pp. 3/1–3/5 (1995).

Y.C. Yan et al., *Appl. Phys. Lett.*, vol. 71, No. 20, pp. 2922–2924 (1997).

Corin B.E. Gawith et al., *Applied Physics Letters*, vol. 75, No. 24, pp. 3757–3759 (1999).

David I. Veasey et al., *IEEE Journal of Quantum Electronics*, vol. 33, No. 10, pp. 1647–1662 (1997).

U. Koren et al., *IEEE*, pp. 17–18 (1997).

W.L. Barnes et al., *Journal of Lightwave Technology*, vol. 7, No. 10, pp. 1461–1465 (1989).

J.J. Pan et al., *IEEE*, pp. 747–750 (1997).

David Veasey, *Molecular Optoelctronics Corporation*, (1999).

J. Amin, *NIST, Optoelectronics Division (815.04)*, pp. 1–41 (1996).

A.M.J. Koonen et al., *System Requirements and Opportunities for Lossless Integrated Active Splitters*.

G.A. Ball et al. *Continuously Tunable, single–frequency, linear fiber–lasers with Bragg rating reflectors*.

J.J. Pan et al., *Continuously Tunable High Power Fiber Lasers with 11nm Tunability*.

D. Barbier et al., *Tunability of Yb/Er Integrated Optical Lasers in Phosphate Glass*.

K.J. Malone et al., *Integrated Optic Laser emitting at 905, 1057, and 1356nm*.

D. Barbier et al., *Yb/Er Integrated Optics Amplifiers on Phosphate Glass in single and double pass configurations*.

M. Saruwatari et al., *Applied Physics Letters*, vol. 24, No. 12, pp. 603–605 (1974).

G.P. Lees et al., *Electronics Letters*, vol. 32, No. 4, pp. 332–333 (1996).

L. C. Barbosa et al., *Electronics Letters*, vol. 32, No. 20, pp. 1919–1920 (1996).

M. Pollnau et al., *Appl. Phys. Lett.*, vol. 66, No. 26, pp. 3564–3566 (1995).

C. Sada et al., *Applied Phys. Letters*, vol. 27, No. 26, pp. 3431–3433 (1998).

W. H. Loh et al., *Appl. Phys. Lett.*, vol. 66, No. 25, pp. 3422–3424 (1995).

P.N. Pennington et al., *IEE Proceedings*, vol. 137, pp. 11–20 (1990).

K. J. Malone et al., "Integrated optic laser emitting at 906, 1057 and 1358 nm", (Mar. 1993).

F. Di Pasquale et al., *J. of Quantam Electronics*, vol. 30, No. 5, pp. 1277–1282 (1994).

M. Federichi et al., *Photonics Tech. Letters*, vol. 7, No. 3, pp. 303–305 (1995).

S. Taccheo et al. *Optical and Quantum Electronics*, vol. 31, pp. 249–262 (1999).

Peter C. Noutsios et. al. *IEEE Journal of Quantum Electronics*, vol. 27, No. 3 pp. 549–555 (Mar. 1991).

A. Miliou et al. *IEEE Journal of Quantum Electronics*, vol. 25, No. 8 pp. 1889–1897(Aug. 1989).

A. Beguin et al. *Journal of Lightwave Technology*, vol. 6, No. 10 pp. 1483–1487 (Oct. 1988).

Blenio J.P. da Silva et al. *Applied Optics*, vol. 36, No. 24 pp. 5949–5950 (Aug. 1997).

Carterina Ciminelli et al. *Applied Optics*, vol. 37 No. 9 pp. 2346–2356 (Apr. 1998).

ION EXCHANGE TECHNOLOGY FOR FABRICATION OF WAVEGUIDE SOURCE LASERS

STATEMENT AS TO PRIORITY

Benefit under 35 U.S.C. §119 is claimed for U.S. provisional application Ser. Nos. 60/117,477, filed Jan. 27, 1999, and 60/162,458, filed Oct. 29, 1999.

STATEMENTS AS TO RIGHTS TO INVENTIONS MADE UNDER FEDERALLY SPONSORED RESEARCH AND DEVELOPMENT

Certain aspects of these inventions were developed with support from NIST (National Institute for Standards and Technology). The U.S. Government may have rights in certain of these inventions.

FIELD OF THE INVENTION

This invention relates to the field of optics and lasers, and more specifically to a method and apparatus of integrating one or more optical waveguides on a glass substrate and of forming lasers therein.

BACKGROUND OF THE INVENTION

The telecommunications industry commonly uses optical fibers to transmit large amounts of data in a short time. One common light source for optical-fiber communications systems is a laser formed using erbium-doped glass. One such system uses erbium-doped glass fibers to form a laser that emits at a wavelength of about 1.536 micrometer and is pumped by an infra-red source operating at a wavelength of about 0.98 micrometer. One method usable for forming waveguides in a glass substrate is described in U.S. Pat. No. 5,080,503 issued Jan. 14, 1992 to Najafi et al., which is hereby incorporated by reference. A phosphate glass useful for lasers is described in U.S. Pat. No. 5,334,559 issued Aug. 2, 1994 to Hayden, which is hereby incorporated by reference. An integrated optic laser is described in U.S. Pat. No. 5,491,708 issued Feb. 13, 1996 to Malone et al., which is hereby incorporated by reference.

There is a need in the art for an integrated optical system, including one or more high-powered lasers along with routing and other components, that can be inexpensively mass-produced. The system should be highly reproducible, accurate, and stable.

SUMMARY OF THE INVENTION

The invention provides, among its embodiments, a system and method for forming an optical system including a high-powered laser on a glass substrate, and a resulting glass-substrate-based optical system and method for operating the optical system. The invention is further directed to methods for forming optical waveguides on glass substrates, including: forming substrates with multiple waveguides and including wherein at least two of the multiple waveguides have differing wavelengths.

Further embodiments of the invention provide a laser component that includes a glass substrate doped with a laser species and having one or more, preferably multiple, waveguides defined by channels within the substrate. (As used herein, a "channel within the substrate" is meant to broadly include any channel formed on or in the substrate, whether or not covered by another structure or layer of substrate.) Each substrate waveguide (or "channel") is defined within the substrate as a region of increased index of refraction relative to the substrate. The glass substrate is doped with a laser species which can be optically pumped (preferably a rare-earth element such as Er, Yb, Nd, Ho, Tm, Sm, Tb, Dy or Pr or a combination of such elements such as Er and Yb) to form a laser medium which is capable of lasing at a plurality of frequencies. Mirrors or distributed Bragg reflection gratings may be located along the length of a waveguide for providing feedback to create a laser-resonator cavity. One or more of the mirrors or reflection gratings is made partially reflective for providing laser output.

DETAILED DESCRIPTION OF PREFERRED EMBODIMENTS

The laser component may constitute a monolithic array of individual waveguides in which the waveguides of the array form laser resonator cavities with differing resonance characteristics (e.g., resonating at differing wavelengths). The component may thus be used as part of a laser system that outputs laser light at a plurality of selected wavelengths. In certain embodiments of the invention, the resonance characteristics of a waveguide cavity are varied by adjusting the width of the channel formed in the substrate which thereby changes the effective refractive index of the waveguide. The effective refractive index can be changed by modifying the diffusion conditions under which the waveguides are formed as described below. Changing the effective refractive index thus changes the effective length of the waveguide cavity which determines the wavelengths of the longitudinal modes supported by the cavity. In another embodiment, the resonance characteristics of the waveguide cavities are individually selected by varying the pitch of the reflection gratings used to define the cavities which, along with the effective refractive index for the propagated optical mode, determines the wavelengths of light reflected by the gratings. In still other embodiments, the location of the gratings on the waveguides is varied in order to select a laser-resonator cavity length that supports the desired wavelength of light.

In a preferred embodiment, the waveguide or multiple waveguides, optionally as part of a laser element, are constructed from a glass substrate which is a phosphate alkali glass doped with a rare-earth element such as Er or Yb/Er. In the case of Yb/Er doped glass, it is preferred for maximal lasing efficiency that the Yb/Er ratio is from approximately 1:1 to 8:1, particularly 3:1 to 8:1. This has been discovered as a result of investigation as to the optimal erbium and ytterbium rare earth ion concentrations in rare earth doped laser glasses, in particular as erbium and ytterbium 1.54 $\mu$m laser sources and amplifiers employed in the fields of telecommunication and data transmission. Prior to this investigation, erbium/ytterbium doped glasses for such applications were typically characterized by low erbium concentration (generally much less than 1 wt % $Er_2O_3$ content) with a corresponding high ytterbium content (typically at a ion ratio of greater than 10 ytterbium ions for each erbium ion input to the glass); such glasses are disclosed in, for example, U.S. Pat. No. 5,334,559 and U.S. Pat. No. 5,491,708. Such high levels of Yb were initially expected to yield high output powers and high slope efficiency based on prior experience with silicate and phosphate glass formulations, see for example U.S. Pat. No. 4,962,067. The prior art taught that low erbium doping levels (at most 0.15 mole % $Er_2O_3$) were required to avoid self quenching effects, and that the ytterbium content be set as high as possible (basically input $Yb_2O_3$ to near the solubility limit in the glass, at least 6 mole % $Yb_2O_3$) in order to optimize the amount of pumping light absorbed within the laser glass.

However, according to this invention, it has been discovered that glasses with a Yb/Er rare earth content of from about 1:1 to 8:1 (particularly the glass called NIST-1T or IOG-1, a sodium-aluminum-phosphate glass having a content in melt of 1.15 wt % $Er_2O_3$ and 4.73 wt % $Yb_2O_3$) demonstrated a higher output power (up to 180 mW compared to a prior high of only 16 mW) and higher slope efficiency (of at least 28% compared to a prior high of only 27%).

The inventors first expected that the poor performance of the prior art glasses was attributed to, at least in part, residual hydroxyl groups left in the glass. Rare earth ions excited in the glass are known to exchange energy with hydroxyl vibrational overtones in the glass, effectively robbing the excited state ions of the stored energy otherwise used to produce amplified laser emission. To investigate this possibility a series of sodium-aluminum-phosphate glasses containing 0.5wt % $Er_2O_3$ and 8.94wt % $Yb_2O_3$ with different hydroxyl content were prepared. The residual hydroxyl content in these glasses is proportional to the measured infrared absorption at 3.0 um and is detailed in Table 1.

TABLE 1

Hydroxyl Content Investigation in Sodium-Aluminum-Phosphate Glass

| Melt ID | Absorption at 3.0 um [$cm^{-1}$] |
| --- | --- |
| NIST-1L | 0.72 |
| NIST-1H | 1.77 |
| NIST-1J | 6.02 |

The results of this work indicated that although residual hydroxyl content certainly was detrimental to laser performance, it could not alone account for the poor performance of devices fabricated in these three glasses. In fact, melt NIST-1H and NIST-1L were characterized by an absorption at 3.0 um below 2.0 $cm^{-1}$, a level expected to be low enough not to significantly influence laser performance. In particular, the absorption level in melt NIST-1L was less than 1.0 $cm^{-1}$, a threshold value below which the prior art has shown is not an issue in evaluating laser performance of a given laser glass, see Cook, L. M. et al, Proc SPIE Vol. 505, pp 102–111 (1984).

As a result, it was determined that the selected doping levels of Er and Yb themselves must be far from optimal. In particular, it was realized that there are performance tradeoffs related to the Yb-doping concentration, the Er-doping concentration, and the Yb/Er-doping ratio within the glass. For example, as indicated earlier, it had been generally thought that the more Yb doping will always result in better laser performance. The inventors instead selected an alternate approach to optimizing the amount of Er and the Yb/Er ratio. The approach involves evaluating the relative performance tradeoffs between Yb-Er cross-relaxation efficiency and the total number of inverted Er ions in the laser cavity.

Spectroscopic evaluations of the NIST-1 glass were performed to determine the cross relaxation coefficient of the Yb-Er energy transfer mechanism. The cross relaxation efficiency, $\eta$, of ytterbium to erbium ion in the glass was estimated by the inventors to be given by, $$\eta = 1 - \tau_{Yb-Er}/\tau_{Yb}$$

where $\tau_{Yb-Er}$ is the measured lifetime of the $Yb^{3+2}F_{3/2}$ level in a codoped sample with Er (measured at $1.79 \times 10^{-3}$ seconds) and $\tau_{Yb}$ is the measured lifetime of $Yb^{3+2}F_{5/2}$ level in a sample with no erbium (measured at $1.37 \times 10^{-3}$ seconds). The value of $\eta$ was thus calculated to be 0.87. Additional description of this modeling method, but applied to silicate glasses having greatly inferior laser properties, is provided in "Rigorous Scalar Modeling of Er and Er/Yb-doped Waveguide Lasers" (Veasey, Gary, Amin) which is incorporated by reference.

The doping selection modeling method provided the following conclusions: as more Yb is incorporated into a glass with a constant Er concentration, the average distance between Er ions and Yb ions decreases, thus causing a rise in the cross relaxation efficiency of Yb-Er energy transfer. The disadvantage of this is that more of the pump power is absorbed in a shorter distance. The result is that less Er ions will be inverted in a certain length, thus there will be less gain available as well as additional reabsorption loss in the 3-level Er ion laser system. Laser performance will suffer. The penalty will be higher thresholds and lower slope efficiencies. To obtain the best possible performance, both the Yb-Er cross relaxation and the total number of inverted ions as a function of pump power must be optimized simultaneously. For a particular device, based on the absorption characteristics of ytterbium at the excitation (pump) wavelength (the absorption cross section at the optimal pump wavelength of 980 nm is $14.5 \times 10^{-21}$ $cm^2$) and the intended device length (2.2cm) the modeling pointed to a glass doped with 1.15 wt % $Er_2O_3$ and 4.73 wt % $Yb_2O_3$ with an Er concentration of $1 \times 10^{20}$ ions/$cm^3$. Although Er concentrations up to $6 \times 10^{20}$ ions/$cm^3$ can be used, the total doping concentration is constrained only by the solubility for rare earths within the glass host, the levels as high as $10 \times 10^{20}$ rare earth ions per $cm^3$ are known, see U.S. Pat. 5,077,240 and 5,039,631. These unusual doping levels were selected despite the conventional wisdom that taught that such an erbium doping content was twice the maximum and that the selected ytterbium content was $1/4^{th}$ to $1/5^{th}$ the prior art levels for a high performance laser device. Based on the results achieved with the discovered optimal doping levels, lasers based thereon can provide more power than currently available from high end diode lasers for telecommunication and data transmission applications. Conventional diode lasers typically have output powers of 2 to 20 mW. The lasers of this invention have output power that is limited only by the available pump power, up to values that can exceed 20 mW, e.g., 25–180 mW. Such power levels allow the use of glass waveguide lasers in metropolitan area networks without the need for expensive optical amplifiers in the network. The advantages are shown particularly for lasers having a length of 15 mm or less.

In preferred embodiments, the doping level, i.e., concentration, of Er ions is from >0 up to 5 or $6 \times 10^{20}$ ions/$cm^3$ and the Er/Yb ratio is about 4:1. Although ratio's of about 1, 1.5, 2, 2.5, 3, 3.5, 4.5, 5, 5.5, 6, 6.5, 7, 7.5 or 8 to 1 can be useful.

In another preferred embodiment, improved ion exchange methods are used to create channels defining the waveguides in the glass substrate. Generally, a surface of the glass substrate is exposed to an ion-exchange solvent through a mask layer having one or more line apertures corresponding to the channel or channels (for multiple waveguide embodiments).

Processing steps include the generation of waveguides within the glass substrate using K+–Na+ ion exchange through channel apertures fabricated by standard microlithographic techniques. For example, a $KNO_3$ solvent can be used applied through an aluminum mask layer to perform the K+–Na+ ion exchange. The exchange of K+ for Na+ ions in the substrate produces a channel in the exposed portion of higher refractive index than the remainder of the substrate, thus, defining a waveguide. Additionally, nitrate melts of of any mixture of the following nitrate salts: lithium nitrate, sodium nitrate, potassium nitrate, rubidium nitrate, cesium nitrate, copper nitrate, silver nitrate and thallium nitrate, for example, can be used for the ion-exchange to provide the waveguide.

However, the inventors have discovered that the glass is etched significantly when exchange is done in an aluminum crucible in the open atmosphere of box oven. Therefore, according to the invention, it was discovered that performing the ion-exchange in a borosilicate, e.g., pyrex, crucible, as opposed to an aluminum crucible, greatly reduced the amount of surface attack and etching of the phosphate glasses caused by the KNO3 ion-exchange melt. Further, improved control of the water content of the melt by baking the $KNO_3$ at a temperature of 120° C. or more, preferably about 120° C., for a period of 24–48 hours in an inert argon atmosphere was achieved. Additionally, providing a $SiO_2$ buffer layer coating by sputtering or CVD deposition will reduce surface scattering losses.

The ion-exchange process results in a slightly buried waveguide with the highest index in the waveguide occurring slightly below the surface. This provides the additional advantage of reducing scattering loss. This advantage can be even further enhanced to provide a channel with a shape and size optimized for laser operation by conducting a field assisted ion-exchange process using an electric field, particularly an electric field varied as a function of time wgere the electric field is applied using a liquid sodium nitrate electrode or a solid silver electrode. The temperature can also be varied as a function of time for further tailoring of the index profile within the waveguide.

According to this embodiment, lasers prepared from ion-exchanged waveguides can achieve a high power of over 20 mW, particularly 25 to 180 mW and a high slope efficiency of 28% or higher (previous state-of-the-art in phosphate glass was 16 mW power and 27% slope efficiency by D. Barbier, et al., at Conference on Optical amplifiers and applications, 1995). Further, a high coupling efficiency of pump light from the optical fiber is enabled by the low index change caused by potassium-sodium ion exchange. High coupling efficiency of signal light to the optical fiber is also achieved due to the low index change caused by potassium-sodium ion exchange.

Glasses used as substrates for the above ion-exchange methods include sodium-aluminum-phosphate formulations such as the composition described above, additional glasses are disclosed in, for example, U.S. Pat. No. 5,334,559 and U.S. Pat. No. 5,491,708. Particular applicability is found with glass formulations identified above in the category of rare earth doped sodium-aluminum-phosphate compositions, in particular having the Er/Yb ratio described above. Rare earth ions of choice include erbium and ytterbium, resulting in compatibility with currently commercially available, inexpensive, semiconductor pump lasers and emission within the telecommunications wavelength region about 1.5 µm, particularly 1.54 µm, ytterbium alone to result in laser sources at 1.0 µm, for use in standardized clock apparatus, and neodymium to result in preparing laser sources for small, localized optical networks at 1.06 µm and optical sensors and for gas detection. However, further examples of useful devices for the described ion-exchange process include glasses doped with other rare earth ions, for example, Pr lasers, Ho lasers, Tm lasers, as well as Dy, Sm, Eu and Tb lasers. Representative wavelengths are listed below in Table 4, see, also, Emmett, et al., *Physics of Laser Fusion*, Vol. IV, "The future development of high-power solid state laser systems", Lawrence Livermore National Laboratory, UCRL-53344, November 1982.

TABLE 4

| Approximate wavelength ranges of several lanthanide dopants | |
|---|---|
| Er | 1520–1610 nm |
| Yb | 985–1250 nm |
| Pr | 1300–1400 nm |
| Ho | 2000–2200 nm |
| Tm | 1600–2100 nm |
| Nd | 860–900 nm, |
|  | 1020–1100 mn, |
|  | 1320–1390 nm |

According to this embodiment of the invention preparation of small waveguide laser sources that produce high output power and that exhibit low pumping threshold levels and high slope efficiency for generation of laser emission compared to the prior art can be achieved, for example.

A further preferred embodiment of carrying out ion exchange, in the manner described above or otherwise, the inventors have discovered that carrying out the process in the absence of ambient atmosphere is advantageous due to the lessening of surface etching due to reactions of the glass surface with water vapor in the ambient air. According to this embodiment of the invention, processing conditions that allow successful fabrication of waveguide structures in phosphate glass substrates by ion exchange technology without the substrate exhibiting signs of chemical attack that influence waveguide integrity or quality are described.

This embodiment of the invention relates to waveguide lasers that are capable of high power operation and that exhibit low pumping threshold levels and high slope efficiency. These waveguides are prepared in rare earth doped phosphate laser glasses using ion exchange technology. Two basic technologies are commonly employed. In the first, ions of one type are exchanged for ions of another type within selected regions of a glass surface. The ions are selected such that the refractive index within the desired waveguide is higher than in the surrounding substrate glass. Here, the ion source is from a molten bath, often described as a salt batch, into which the glass is submerged.

Common salt baths contain alkali salts such as potassium nitrate, sodium nitrate, and/or other salts such as silver nitrate. In addition to a requirement of higher index within the waveguide, a second criteria in salt bath identity selection is to select ions that are highly mobile within the glass structure and offer melting points consistent with acceptable diffusion rates and melting points of the employed salts.

In a second technique, the ions to be placed into the glass are first applied as a solid to one or more glass surfaces. Electrodes are then placed onto the glass surfaces (in some cases the ion source can also act as an electrode, for example in the case of silver ion exchange) and an electric field through the glass then assists in driving the ion exchange process.

Additionally, both types of ion-exchange techniques can be conducted to provide the desired waveguides.

Glasses used as substrates for the lasers of this invention are of a sodium-aluminum-phosphate formulation such as the compositions listed in, for example, U.S. Pat. No. 5,334,559. A simple example of waveguide fabrication to produce a waveguide laser in phosphate glass is disclosed in U.S. Pat. No. 5,491,708.

Phosphate glasses are typically characterized by inferior chemical durability, and are particularly susceptible to attack by acidic solutions and by direct water attack. This can be demonstrated by a review of chemical resistance tests on common commercial phosphate glasses, see for example the Schott Optical Glass Catalog. Water, although not strongly acidic in nature, attacks the phosphorous sites within the glass structure leading to the formation of a phosphoric acid film on glass surfaces which are then responsible for acid attack of the remaining glass.

Phosphate glasses also have inferior resistance to alkali. Examples of this phenomena are demonstrated in the Laser Glass Brochure from Schott. All of the phosphate laser glasses in the brochure have inferior alkali resistance when compared to the silicate laser glasses listed in the same brochure. Any OR existing in a salt bath can combine with the alkali ions present, such as $K^+$ and/or $Na^+$, and form an alkaline solution that will attack the surface of a phosphate glass submerged in the salt bath for ion exchange.

Schott Glass Technologies (SGT) and the National Institute of Standards and Technology (NIST) have engaged in a collaborative research effort to develop advanced guided wave laser sources through the fabrication of small compact laser waveguides in rare earth doped phosphate laser glasses. These waveguides were prepared within the glasses by ion exchange technologies, including replacement of sodium ions within the substrate glass by either potassium ions or silver ions from the surrounding environment. The ion exchange locations were first defined by preparation of a mask that defined the waveguide regions, typically narrow stripes on the glass surface of width less than 50 µm.

Although the phosphate glasses developed for this work are designed to exhibit good chemical durability and have been characterized to offer superior chemical durability than conventional state-of-the-art phosphate optical glasses, the need for further improvement was identified. Particularly, it had been observed that resultant waveguides were of poor optical quality. In particular, glass surfaces were observed to be stained with a white appearance to the eye. In addition, sections of the waveguides were found to exhibit at various times the following defects: a) narrowing of the waveguide width at unpredictable locations, b) widening of the waveguide at unpredictable locations (independent of other defects), and c) depressed regions relative to the surrounding, unexchanged, glass substrate.

Although not intending to be bound by this theory, it was believed that a dominant mechanism for chemical attack of the phosphate glasses during ion exchange was by residual hydroxyl ions within the salt bath or trapped within the glass/electrode interface during field assisted ion exchange. The mechanism was as follows: OH groups from the surrounding environment enter the glass, breaking the basic phosphorous/oxygen back bone responsible for the glass structure, i.e.:

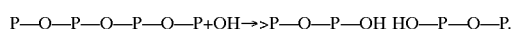

In moderate cases of attack, glass durability is further degraded by the loss of backbone structure. In severe cases of attack, phosphorous could even be expected to leave the glass and migrate to the surface, presenting the white appearance observed in many of the defects within prepared waveguides.

The dominant source of water in molten salt bath ion exchange processes was thought to be residual hydroxyl within the starting salts since these chemicals are inherently hydroscopic. Ways to deal with control of this water were considered: addition of agents to the salt bath to "tie up", including powdered aluminum, silicic acid, anhydrous aluminum oxide, diatomaceous earth, free $P_2O_5$, halogen containing chemicals that would react with OH to form volatile halide gases, etc.; and, bubbling of a dry gas through the salt bath to achieve direct water removal (dehydration).

A second source of water is the ambient air within the ion exchange furnace. Here, effective corrective actions discussed were: purging the oven environment (preferably prior to, but also during salt bath insertion) while at elevated temperatures with a dry gas and isolation of the salt bath from the environment (since the refractory within most furnaces acts as a sponge for atmospheric water during periods of inactivity that is later released upon application of high temperature to the furnace).

A third source of OH groups can be actual adsorbed water on the surface of the glass part to be treated. Phosphate glasses are known to adsorb water onto their surfaces from the atmosphere. Diffusion coefficients for water into phosphate glasses have been evaluated at several orders of magnitude higher than silicate glasses for the same measurement temperature. Such surface absorbed water can provide hydroxyl that can further re-react with glass surfaces during later processing, for example during field assisted ion exchange.

A number of measures were studied to understand, and control or eliminate the waveguide defects:

1) The current aluminum ion exchange crucible would be modified to allow possible bubbling of dry, and possible reactive, gases through the melt prior to insertion of glass substrates. The role of reactive gases was stressed during the meeting. Normal "dry" gases might quickly reach chemical equilibrium with the moisture in the salt bath, preventing the gas bubble to further dry the melt. A reactive gas within the melt (in particular, the use of chlorine) would react with water diffusing from the melt into the bubble, effectively maintaining the chemical gradient between the melt and bubble and allowing additional drying action to take place.

2) The ion exchange oven would be equipped with gas purge lines to pressurize the oven for purposes of moisture removal. Care would be taken to purge the oven before insertion of the salt bath since the oven refractory were considered as a major moisture source when heated.

3) Alternative crucible materials would be considered. In particular, Schott had reason to believe from trials to ion exchange phosphate glasses for purposes of chemical tempering that fused silica crucibles might offer improved performance in terms of chemical attack of treated glasses.

4) The addition of drying or other agents that could "tie up" hydroxyl groups in the melt was also discussed but no clear implementation plan was apparent at the close of the review meeting.

5) A fixture would be designed to allow placement and or removal of a preheated glass plate into a preheated and presumably dry salt bath without opening the oven to the surrounding ambient air within the ion exchange laboratory. This step would provide an opportunity to keep the glass/salt bath system isolated from room air during the entire course of the ion exchange process.

6) Since molten salt baths are expected to accumulate hydroxyl, or other contamination with time from the surrounding environment and treated glass plates, salt baths would be changed more frequently, in particular upon first visual evidence of a defect problem.

The corrective steps described above make possible the preparation of waveguide laser sources without the occurrence of waveguide defects linked to chemical attack of the phosphate glass substrate. This should enable the easier commercialization of these waveguide sources. Without this invention, reproducible performance levels in devices fabricated in a large scale manufacturing environment would be expected to exhibit erratic performance and/or low yield with associated high manufacturing costs due to unpredictable chemical attack from residual hydroxyl groups with associated defect creation that impacted device performance.

Additional embodiments of this invention are directed to optical devices having multiple waveguides on a substrate. The processes described above, while also applicable to preparing singular waveguides and lasers based thereon, are additionally applicable in preparing substrates having multiple waveguides and lasers based thereon.

A substrate containing multiple waveguides can be provided by photolithographic techniques and ion-exchange methods discussed above. Both involve applying a mask over the substrate to define the channels which will constitute the waveguide. By applying a mask with multiple channels over the substrate, a substrate with multiple waveguides therein can be formed. Additionally, multiple waveguides having differing refractive indices, and thus capable of providing lasing at differing wavelengths when incorporated in a laser device, can be formed by applying a mask which defines channels of differing width. The resulting waveguides formed by photolithography or ion-exchange techniques will have differing widths and thus differing refractive indices and can, thus, be used in a laser device to provide a laser capable of operation at differing wavelengths depending upon which waveguide is pumped. In other words, the waveguides form laser-resonator cavities with distinct resonance characteristics to provide a distinct lasing action at a selected wavelength when pumped. These waveguides can also be modified in any of the manners discussed above and below to vary their properties. The substrates used to provide the multiple waveguide devices are preferably based on the glasses discussed above.

Another embodiment of the invention is directed to modifying or tuning the wavelengths of a waveguide or waveguides in a substrate. This can be done by heating of the substrate which will alter the wavelengths of the waveguides therein. Where the substrate containing waveguide(s) is part of a laser device, it was expected that the heating thereof would increase the wavelength of the laser due to expansion of the diffraction grating periodicity. What the inventors have discovered, however, is that for substrates containing solid state waveguides provided as channels in the substrate, as discussed above, heating has a fine tuning effect on altering the wavelength of the waveguide. Thus, for example, while semiconductor DFB lasers are increased in wavelength upon heating, the increase of wavelength upon heating of laser devices with waveguides according to this invention is significantly lower as a function of the temperature, eg., the increase of wavelength as a function of temperature is roughly 15 times lower than that for semiconductor GFB lasers. The inventors have discovered that while heating expands the glass increasing the wavelength, the extent of increase is offset by the temperature effecting a decrease of the refractive index with temperature of the glass forming the waveguide(s). The theory behind this and experiments supporting it are described in the Journal of Non-Crystalline solids (JNCS) article "Rigorous Scalar Modeling of Er and Er/Yb-doped Waveguide Lasers" (Veasey, Gary, Amin), particularly at page 14 and in FIG. 14. According to the invention, therefore, the temperature control requirements for maintaining a stable wavelength are relaxed with the waveguides according to the invention, i.e., a variance in the temperature will not have as significant effect on the tuning, allowing finer tuning thereof.

In another aspect of the invention it may be of advantage to fabricate active waveguide devices, either having one or multiple waveguides, that employ regions of active (for example, rare earth doped) and passive (for example lanthanum doped) glass sections. This is preferably done by preparing the active and passive sections separately and bonding them together. Examples of the sections to be bonded together include the single or multiple waveguide devices discussed above. There are a number of techniques possible to complete the bonding operation, including the use of UV or thermally curable epoxy adhesives available on the open market. There are other techniques that do not require adhesive materials, including a process wherein the parts to be bound are joined by a high temperature fusion process.

According to the invention, such bonded parts can be formed in the following manner. Glass blocks to be joined are first cut to a size suitable to yield one or more finished devices. The surfaces to be joined are then ground and polished. A high quality polish is not a requirement but is an advantage. However, simple grinding with 600 grit emery paper is adequate. Next, the samples are thoroughly cleaned using techniques well known in the optical industry. The surfaces to be joined are then placed in direct contact, forming a multiple laminate structure. A fusion of the glass pieces is then conducted by heating the entire assembly to a temperature above, generally about 100° C. above, the glass transformation point, Tg, for a period of time to effect fusion thereof, preferably between 0.5 and 2 hours. The fused parts are then cooled, for example, to about 30° C. above Tg, held there to allow thermal uniformity, for example for 2–4 hours, followed by a slow cooling ramp drop, e.g., of 30° C. to 50° C., to room temperature. The joined fused parts can then be cut, ground, and polished as needed. The waveguide can be provided in the fused blocks before the fusion takes place, in which case they must be aligned to be in communication, or the waveguide can be provided in the fused block after fusion thereof.

For a glass such as NIST- 1T discussed above, the glass transformation point, Tg, as measured by dilatometry is 474° C. Consequently, a good fusion temperature is 575° C. to 590° C., with controlled cooling onset point of about 500° C. Note that the softening point of the NIST-1T glass is in the range of 560° C. to 565° C. It is thus equivalent to say that the fusion is performed at a temperature above the softening point of the glass.

One disadvantage of the fusion process is that the joined parts need to be closely matched in thermal expansion and in Tg, e.g., in the range of ±30° C. for Tg and in the range of ±1 to ±10×10−7/K in thermal expansion. Higher mismatches in thermal expansion lead to high levels of residual stress at the glass/glass boundary points due to unequal thermal contraction during the cooling of the joined assembly to room temperature. This criteria is readily satisfied by substituting lanthanum for the active rare earth ions in the NIST-1T glass to prepare the passive material. In this way, the changes in these properties are minimized without altering the sodium-aluminum-phosphate base glass composition. If necessary, the base composition can also be modified to bring the Tg and thermal expansion values closer, but this can be done without seriously altering the ion exchange properties so that waveguide fabrication in both the passive and active portions of the prepared assembly can be conducted with minimal adjustment to accommodate different diffusion properties that could alter ion exchange behavior.

Waveguides prepared in accordance with any of the above descriptions, having multiple or single waveguides of the same or differing wavelengths, are useful in preparing lasers by providing the waveguide with a grating pattern. Examples of methods for producing lasers from waveguides of the type discussed above are provided in "Arrays of Distributed-Bragg-Reflector Waveguide lasers at 1536 nm in YB/ER-co-doped Phosphate Glass" (Veasey, Funk, Sanford, Hayden); "170 mW eb at 1540 nm from an Erbium/Ytterbium Co-doped Glass Waveguide: Laser" (Funk, Veasey, Peters, Sanford, Hayden); and "Ion-exchanged Er+/YB3+ Glass Waveguide Lasers in Silicate Glasses" (Peters, Veasey, Funk, Sanford, Houde-Walter, Hayden), which are incorporated herein by reference. These references also discuss methods generally applicable to production of waveguides and those teachings are additionally incorporated by reference herein. In general, lasers are fabricated from the waveguides by providing a reflecting element at both ends of the waveguide. The reflecting elements can be those known in the art. Included as embodiments are waveguides having optically polished ends provided with mirrors on both ends. An additional preferred embodiment, is providing the waveguide with a diffraction grating on one end of the waveguide. In a preferred embodiment, the grating is provided by etching onto the glass substrate containing the waveguide(s). One preferred type of grating is a DBR grating as known in the art. Such grating are advantageous because they provide a narrow reflection line and thus provide a laser with a narrower wavelength.

One embodiment provides making the photoresist grating by evaporation of a chromium coating with the specimen inclined 60 degrees to the normal of the evaporation source beam. This results in a hard metal coating on the tops of the photoresist bars that constitute the grating and thus allows a more selective sputter etch of the grating and the use of higher DC bias voltages for the etching process.

One embodiment provides a DBR grating exposure in standard photoresist using an optical phase mask. Additionally, providing a $SiO_2$ buffer layer coating by sputtering or CVD deposition will reduce surface scattering losses. While it is difficult to get standard photoresist to propertly adhere to phosphate glasses, application of sputter deposited $SiO_2$ on the surface of the phosphate glass, e.g., 1–2 nm, will greatly improve adhesion of the photoresist during processing.

One embodiment provides for actively monitoring the diffraction efficiency of the photoresist grating mask during photoresist developing. This optimizes the contrast of the photoresist grating and thereby provides for enhanced etch selectivity.

One embodiment provides etching of the grating by Ar-ion sputtering in a standard Reactive-Ion-Etching system. No CFC (chlorinated fluorocarbon) emissions, as with reactive-ion-etching of silica glass, are observed.

One embodiment provides many gratings that are exposed in photoresist fabricated on each single glass chip on a wafer in a single exposure using a silica plate that has multiple pitch phase masks printed on it.

One embodiment provides a nearly sinusoidal grating without excess loss due to improved isotropic plasma etching using only Argon gas at low pressure.

One embodiment provides an isotropic etching in an argon ion plasma leaving a smooth surface resulting in lower grating scattering losses.

One embodiment provides each grating with accurate line width control due to phase mask exposure of photoresist and control of differential linewidth using phase masks with more than one period on a single substrate.

One embodiment provides a laser wavelength that is selected by printing a single pitch grating over an array of optical waveguides with each waveguide in the array having a different refractive index.

One embodiment provides a laser wavelength that is selected by fabricating a single pitch grating on an array of identical optical waveguides where each waveguide crosses the grating at varying angles.

One embodiment provides a mode field shape and size that is optimized for laser operation using a filed assisted ion-exchange process where the electric field is varied as a function of time.

In one embodiment, the invention can provide a monolithic single-frequency waveguide laser in a spectroscopically superior phosphate glass, for example, with an initial laser linewidth was 500 kHz.

The present invention provides predictable emission wavelength if effective index of the waveguide is known.

The present invention provides high power, e.g., up to 80 mW (previous state-of-the art for an Er-doped DBR laser was ~2 mw by Technical University of Denmark Microelectronic Centrct. Technology was sputter deposited silica doped with Er).

The present invention demonstrates a Yb/Er-doped phosphate glass laser using a DBR surface relief grating. The previous best device like this utilized an external fiber grating and produced power of 2.2 mW at 70 mW coupled pump power by A. Yeniay, et al., Lehigh University & Lucent, Apr. 29, 1997 in IEEE Photonics Technology Letters. This Yeniay demonstration did not operate as a single frequency laser.

The present invention provides high slope efficiency of 26 percent (previous state-of-the-art for similar devices was about 11 percent by Yeniay, et al., Lehigh University & Lucent).

The following provides some specific embodiments of features discussed above, however, the invention is in no way limited thereto.

The present invention provides a process for forming waveguides onto (or into) the surface of a glass substrate. In one embodiment, photo-lithographic techniques define waveguides by changing the index of refraction of waveguide channels formed into the surface of the substrate. In one such embodiment, a glass wafer, approximately 10 cm by 10 cm by 1 mm is cut from a slab of IOG-1 laser glass available from Schott Glass Technologies, Inc., of Duryea, Pa., USA. The surfaces of interest, including a "top" major surface (where "top" refers to an orientation and not necessarily to the placing of the device as used in operation) are polished to optical smoothness. The glass wafer will have a plurality of segments according to one embodiment of the present invention.

In one embodiment, the top surface of the wafer will be processed to form a large number (e.g., in one embodiment, one hundred devices) of individual segments (each forming an optical system) which will be diced apart and individually packaged. For example, in one embodiment, each segment is a portion of the wafer diced to about 1.5 cm by 0.5 cm.

Another embodiment is directed to segment having forty laser waveguides organized in eight sets. The segments may be processed, for example, according to one of the methods described in "Arrays of Distributed-Bragg-Reflector Waveguide Lasers at 1536 nm in YB/ER-co-doped Phosphate Glass" (Veasey, Funk, Sanford, Hayden); "170 mW eb at 1540 nm from an Erbium/Ytterbium Co-doped Glass Waveguide Laser" (Funk, Veasey, Peters, Sanford, Hayden); and/or "Ion-exchanged Er3+/YB3+ Glass Waveguide Lasers in Silicate Glasses" (Peters, Veasey, Funk, Sanford, Houde-Walter, Hayden), to form a plurality of sets (e.g., in one embodiment, each set has five waveguides; and in another embodiment, each set id used such that one waveguide is used, and the other four provide redundancy in case one or more do not function properly). In this embodiment, each set is overlaid with a diffraction Bragg reflector (DBR) which forms one mirror of a laser, and each DBR is fabricated to a different spacing designed to resonate at a different output wavelength. In one embodiment, only eight of the forty waveguides are used for eight respective lasers; the others are provided for redundancy. Thus, the DBR for one set is designed such that all five waveguides of that set will lase at the same wavelength, and any one of these waveguides can be used as the laser for the desired wavelength of that set. However, each of the DBRs are designed for a different output wavelength. Thus the segment is designed to provide eight lasing waveguides each outputting light at one of eight predetermined wavelengths that are tuned by the eight DBRs. In one embodiment, and input mirror (e.g., a multi-layer dielectric mirror) is deposited on an end face of segment opposite the DBRs. In other embodiments, an external mirror is placed against that face to provide the feedback function desired for lasing and the pump-light-launching function. The input mirror is designed to transmit as much light as possible at the pump wavelength (in one embodiment, 0.98 micrometers), while reflecting as much light as possible at the output wavelength (in one embodiment, a selected wavelength near 1.54 micrometers as tuned by the corresponding to the DBR). In one embodiment, the segment is used in a communications system that uses dense wavelength-division multiplexing (DWDM), wherein, for example, forty different wavelengths are each modulated to carry a different channel of information, and then all forty channels are passed on a single optic fiber. In one such embodiment, each channel's wavelength differs from the next channel's wavelength by 0.8 nanometers. Thus, for example, a segment could be designed to output laser light at wavelengths of 1.5360, 1.5368, 1.5376, 1.5384, 1.5400, 1.5408 and 1.5416 micrometers. Thus, a forty-channel system only needs five such different part numbers (i.e., unique parts designs), rather than forty different part numbers in conventional approaches.

In another embodiment a segment is used as part of a multi-wavelength laser source. In this embodiment, a pump light source (for example, a semiconductor laser diode lasing at about 0.98 micrometers; this source can even be very "noisy," emitting a range of frequencies from perhaps as low as 0.96 and as high as 1.00 micrometers, and still provide a suitable source for laser emitting at e.g., 1.5360 micrometers) is coupled through a suitable launch-end mirror by butting against the end of a selected waveguide of a set of waveguides. In one such embodiment, eight pump laser diodes are used. At the other end of the segment, eight optic fibers are held by an alignment block, such that each respective fiber is optically coupled to the emitting end of the top or first waveguide of the eight respective sets. If any one of the first waveguides is non-functional, the alignment block can be moved down to couple to the next waveguide of the eight sets.

In another embodiment, a segment is used as part of another multi-wavelength laser source with the output fibers connected to the middle waveguide of each set of waveguides. A different pumping mechanism can be used wherein each pump is coupled through a lens (which can be a conventional convex-type lens or a diffraction or holographic lens) that helps concentrate the light from the pumps into the waveguides.

In another embodiment, a segment is used as part of a single-wavelength laser source. This embodiment provides a single output wavelength selected from the eight available. This embodiment also provides an optical fiber for coupling light from a pump laser diode into the desired waveguide. It is to be understood that any of the above pump-coupling methods and apparatus could be used in the other discussed embodiments.

In another embodiment, a segment having a laser comprising a waveguide, DBR mirror and optional input mirror is provided. The single laser has an external launch mirror. Other embodiments include redundant waveguides all operating at a single wavelength, other waveguides each having a DBR tuned to a unique wavelength, or both, all integrated on a single segment.

In another embodiment, a packaged device that includes a segment according to one of the other embodiments of the present invention is provided. The device includes a hermetic package, and is pumped, in this embodiment, by a fiber, and coupled to an output fiber. While this embodiment includes a laser as described above, it is otherwise a passive device. Such a device takes a pump light input, which can be noisy as described above, and outputs a "clean" laser output light at a different frequency, wherein the output is stable and has a very narrow wavelength spectrum.

In another embodiment an integrated device that includes a segment according to one of the other embodiments of the present invention is provided. The device includes active components such as a pump laser diode, a photodetector (e.g., a light-sensing diode), a thermistor and electrical connections between and to these components. Some embodiments also include a temperature maintaining device (such as a resistor or thermoelectric device to heat and/or cool device) in order to maintain a constant temperature. Some embodiments also include an output modulator to encode information on the output light. Some such embodiments also include an output combiner to combine the modulated light into a single fiber.

In another embodiment, a laser using direct (butt) coupling of pump laser diode to a segment as described in other embodiments is described.

In another embodiment, a top laser using lensed coupling of a pump laser diode to a segment according to one of the embodiments of the present invention is provided.

Lasers incorporating waveguides according to the invention have potentially narrower line widths than current state-of-the-art semiconductor lasers primarily because of the long upper state lifetime of the Er laser manifold in phosphate glass. The Schallow-Townes relationship gives an ultimate limit for solid state lasers of less than 1 Hz compared to approximately 10–100 kHz for diode lasers. The lasers of this invention have been demonstrated to have line widths of less than or equal to 500 kHz, much better than the typical 1 MHZ laser line widths for standard WDM lasers sources used today.

The relative intensity noise (RIN) of solid state waveguide lasers is a distinct advantage over semiconductor lasers for analog fiber telecommunications. This is especially true as analog modulation frequencies increase to multi-GHz transmission rates as is expected to become common place in the near future. The only excess contribution above the shot noise photon statistics is the relaxation oscillation peak which occurs around 500 kHz. Beyond 500 kHz, the RIN drops rapidly in waveguide lasers. This, combined with high glass saturation power, means very low noise lasers can be achieved. In contrast, semiconductor lasers typically have relaxation oscillations between 3 and 10 GHz, which is a potentially important frequency range for optical analog communications.

There are advantages of putting the DBR grating within a passive section of glass attached to the active glass containing the laser waveguide. This is because when the pumplight reaches the DBR grating, it is not reflected but is instead coupled out of the waveguide at an acute angle, thus the pump light intensity gets depleted very rapidly as it traverses in the DBR grating. If the DBR grating were prepared in erbium doped glass, the resultant population of excited erbium ions within the active glass inside the DBR grating leads to an increase in the spontaneous emission noise. And also introduces a loss within the laser cavity which reduces the efficiency.

Another embodiment of this invention is the fabrication of a single-frequency 1.32–1.4 um laser in Nd-doped phosphate glass fused to La-doped glass, as shown in FIG. 2. In this invention, a waveguide is fabricated in the Nd-La fused substrate using the ion exchange process described above. A DBR grating is written in the La section of the substrate. It is necessary to write the DBR grating in the passive section of the substrate since Nd acts as a three level laser system near 1.3 um. Such a design minimizes loss and noise as described above and thus increases the efficiency of the laser. The period of the grating is fabricated to be such that it reflects a single wavelength in the range of 1.32–1.4 um thus produces a single frequency laser in this range. Many water absorption peaks occur in this region of the optical spectrum, therefore such a laser could be used as a high power laser source for the detection of low level water concentration in high purity gases.

Finally, the glass waveguide lasers discussed here will not suffer at all from wavelength drift as in semiconductor lasers. As a semiconductor laser ages, the high optical intensity in the laser cavity causes a change in the index of refraction of the semiconductor material, and consequently a change in the optical characteristics of the laser cavity that results in the wavelength of the laser drifting over time. At some point, the change in the material is so severe that a longitudinal mode hop occurs that causes a large wavelength shift since longitudinal modes in semiconductor lasers have large frequency spacing. When such a event occurs in a WDM network, the effect is usually catastrophic and may bring down the whole network for a short time while the problem source is isolated. This effect is not well studied in phosphate glasses but our intuition is that the effect will not be large. Since the longitudinal modes are also very close (within WDM channel tolerances) mode hopping will not be as severe an effect if aging does in the phosphate glass.

Thus, the devices described here are capable of replacing current semiconductor based laser sources for application in telecommunications and data transmission applications within the 1.5 um telecommunications band. Output powers exceed that required (20 mW) when pumped with inexpensive 980 nm class pump lasers available on the market today.

The devices described can also provide small, compact laser sources for localized optical networks operating at either 1.5 um or near 1.0 um through the use of erbium and neodymium rare earths respectively. In particular, the inventors forsee the need for inexpensive, compact, efficient sources at 1.0 um for use in localized networks within individual aircraft, automobiles, seacraft, etc. Here, the short distance for optical transmission allows the use of conventional optical fiber (that is optimized at 1.3 um and 1.5 um but suffers from dispersion issues at 1.0 um) without accumulated distortion from dispersion effects, in combination with the additional advantage of employing less costly, and easier to operate and maintain than detectors at 1.3 um or 1.5 um, detectors that are sensitive at 1.0 um.

A wide variety of rare earth species and combinations of species can be supported in the glass formulations of this invention. Combined with the laser structures of this invention, a number of laser wavelengths can be made available as coherent light sources for diagnostic and spectroscopic analysis completed with optical techniques.

The entire disclosure of all applications, patents and publications, cited above and below, as well as of U.S. provisional application No. 60/117,477 filed Jan. 27, 1999, and U.S. provisional application No. 60/162,458 filed Oct. 29, 1999, from which this application claims priority are hereby incorporated by reference in their entirety.

EXAMPLES

In the foregoing and in the following examples, all temperatures are set forth uncorrected in degrees Celsius; and, unless otherwise indicated, all parts and percentages are by weight.

Example 1

Er/Yb ratio

An Er: Yb-codoped glass having 1.15 wt % $Er_2O_3$ and 4.73 wt % $Yb_2O_3$ and a high phosphorous content named NIST-1T, shown in Table 2, was prepared as follows. Chemical compounds were weighed in the proper amounts to produced the desired composition and melted within a fused silica crucible at temperatures in excess of 1200° C. to produce vitrified material of limited optical quality, referred to as cullet. To obtain glass of high optical quality for use in laser fabrication, this cullet was then remelted within a platinum crucible at temperatures of 1200° C. to 1300° C. Once this melting was complete, the glass melt was stirred and refined at temperatures up to 1400° C. for three hours prior to casting the molten glass into a steel mold. The cast glass was annealed at 530° C. for two hours before being cooled to room temperature at a cooling rate of 30° C./hr.

TABLE 2

| NIST-1T Example Composition | |
| --- | --- |
| Oxide | Mole % |
| $P_2O_5$ | 60 |
| $Al_2O_3$ | 13 |
| $Na_2O$ | 24 |
| $La_2O_3$ | 1.1 |
| $Er_2O_3$ | 0.4 |
| $Yb_2O_3$ | 1.5 |

The glass casting produced was first cut to yield characterization samples with the following property results:

TABLE 3

NIST-1T Property Characterization Results

| Property | Expected Result | Measured Result |
|---|---|---|
| Nd | 1.523 ± 0.003 | 1.52100 |
| Vd | 67.53 ± 0.05 | 67.50 |
| density, ρ [gm/cm$^3$] | 2.74 ± 0.03 | 2.74 |
| Absorption at 3.0 um [cm$^{-1}$] | <2.0 | 1.20 |

Based on these measured properties, in comparison to the expected results known from prior melts of this glass composition, the proper chemical identity of the prepared glass was assured. It is common practice in the glass industry to have high confidence that the composition is that intended when the index, nd, Abbe number, vd, and density, ρ, agree with expected values within the tolerance ranges indicated in Table 3. The measured optical properties and the measured density value combined with the recorded input weights of rare earth species into the glass allowed the calculation of the following additional properties:

TABLE 4

NIST-1T Calculated Property Results

| Property | Desired Result | Calculated Result |
|---|---|---|
| Yb$^{3+}$ content [10$^{20}$ ions/cm$^3$] | 4.0 ± 5% | 3.97 |
| Er$^{3+}$ content [10$^{20}$ ions/cm$^3$] | 1.0 ± 5% | 0.99 |
| Refractive Index at 1.54 um | no particular value | 1.511 |

The rare earth contents values were verified in this manner. Thirty-eight glass plates were then prepared from the remaining glass from the produced casting. Each plate measured 50 mm×50 mm×2 mm in thickness and was polished on the 50 mm×50 mm faces with a high quality polish normally applied to Schott's commercial filter glass product line.

Waveguide lasers were fabricated in the NIST-1T phosphate glasses. Waveguides were formed by K$^+$–Na$^+$ exchange through channel apertures ranging in width from 3 to 8 μm. The apertures were etched in a 200 nm thick Al mask layer. Standard metal deposition and microlithography techniques were employed to form the waveguide mask. The exchange was performed in a shallow aluminum crucible containing molten KNO$_3$ at 375 °C. for 4 hours in a box furnace.

The ion exchanged specimens were blocked with a similar glass using glycothalate wax and were diced using an automatic wafer dicing saw that employed a resonoid blade. The specimens were cut to a dimension of approximately 2.2 cm×1 cm. The waveguides were parallel to the 2.2 cm long dimension. The waveguide end facets were polished roughly using Al$_2$O$_3$ powder grits of 25 μm size and 9 μm size on flat glass lapping blocks. After the rough polish, the final polish was done using a mixture of cerium oxide and water which was dispensed onto soft lapping material on an automatic polishing machine. After polishing was completed, the samples were deblocked in acetone by the process of ultrasound.

Several measurements were performed to determine the properties of the ion exchanged waveguides. The refractive index as a function of position within the sample was analyzed using the method of refractive near-field scanning. The dimensions of transverse modes of the waveguides were measured by coupling light into one end of the waveguide and imaging the light emerging from the other end onto a calibrated infrared camera.

To test the Yb/Er-codoped lasers, we typically pumped the waveguides using a tunable Ti:Al$_2$O$_3$ laser. FIG. 1 shows a schematic of the laser measurements setup. Placing broadband dielectric mirrors on the polished waveguide end faces formed the laser cavities. The mirrors were held in place by small spring clips with index matching oil between the end facet and the mirror. The pump laser light was launched through one of the mirrors with a 4× microscope objective. The laser output and unabsorbed pump light were collimated with a 16× microscope objective and separated using filters. The mirror through which the pump light was launched had a reflectance of >99.9% and 15% at 1540 and 960 nm, respectively. The output coupler had a reflectance of 80% at 1540 nm and 15% at 960 nm. Neither the waveguide length nor the cavity output couplings were optimized. Additional information for this example can be found in the JNCS article "Rigorous Scalar Modeling of Er and Er/Yb-doped Waveguide Lasers" (Veasey, Gary, Amin).

The unique set of rare earth content in melt NIST-1T was employed to demonstrate higher output power (up to 180 mW compared to a prior high of only 16 mW) and higher slope efficiency (of at least 28% compared to a prior high of 27%) than observed in the prior art, see Barbier, D., et al, Integrated Optics and Optical Fibre Communications, 11$^{th}$ International Conference on, and 23rd European Conference on Optical Communications (Conf. Publ. No.: 448) on Pages: 41–44, Vol. 4.

Example 2

Ion-Exchange

Waveguide lasers were fabricated in Yb/Er-codoped and Yb-doped IOG-1 (equivalent to NIST-1T and NIST-1X) phosphate glasses, discussed in Example 1. The Yb/Er glass was doped with 1.15 wt % Er$_2$O$_3$ (1.0×10$^{20}$ ions/cm$^3$) and 4.73 wt % Yb$_2$O$_3$ (4.0×10$^{20}$ ions/cm$^3$). For the Yb-doped laser, the glass was doped with 4.73 wt % Yb$_2$O$_3$ (4.0×10$^{20}$ ions/cm$^3$). Waveguides were formed by K$^+$–Na$^+$ exchange through channel apertures ranging in width from 3 to 8 μm. The apertures were etched in a 200 nm thick Al mask layer. Standard metal deposition and microlithography techniques were employed to form the waveguide mask. The exchange was performed in a shallow aluminum crucible containing molten KNO$_3$ at 375 °C. for 4 h in a box furnace. The initial ion exchanges took no steps to avoid the interaction of water vapor or oxygen with the ion exchange solvent. Subsequent experiments revealed that this process was not reliable in terms of repeatability and waveguide laser yield. The ion exchanged specimens were blocked with a similar glass using glycothalate wax and were diced using an automatic wafer dicing saw that employed a resonoid blade. The specimen was cut to a dimension of approximately 2.2 cm×1 cm. The waveguides were parallel to the 2.2 cm long dimension. The waveguide end facets were polished roughly using Al$_2$O$_3$ powder grits of 25 μm size and 9 μm size on flat glass lapping blocks. After the rough polish, the final polish was done using a mixture of cerium oxide and water which was dispensed onto soft lapping material on an automatic polishing machine. After polishing was completed, the samples were deblocked in acetone by the process of ultrasound.

Several measurements were performed to determine the properties of the ion exchanged waveguides. The refractive index as a function of position within the sample was analyzed using the method of refractive near-field scanning. The dimensions of transverse modes of the waveguides were measured by coupling light into one end of the waveguide and imaging the light emerging from the other end onto a calibrated infrared camera.

To test the Yb/Er-codoped Fabry-Perot lasers (lasers with no etched gratings), we typically pumped the waveguides using a tunable Ti:Al$_2$O$_3$ laser. FIG. 1 shows a schematic of the laser measurement setup. Placing broadband dielectric mirrors on the polished waveguide end faces formed the laser cavities. The mirrors were held in place by small spring clips with index matching oil between the end facet and the mirror. The pump laser light was launched through one of the mirrors with a 4× microscope objective. The laser output and unabsorbed pump light were collimated with a 16× microscope objective and separated using filters. The mirror through which the pump light was launched had a reflectance of >99.9% and 15% at 1540 and 960 nm, respectively. The output coupler had a reflectance of 80% at 1540 nm and 15% at 960 nm. Neither the waveguide length nor the cavity output couplings were optimized.

A Yb-doped waveguide laser was tested using a setup similar to the one shown in FIG. 1. The Yb$^{3+}$ device was 10 mm in length. The pump-input mirror had a reflectance of 50% at 950 nm and 98% at 1030 nm. Two output couplers with transmittances of 7% and 21% at 1020 nm were investigated. These output couplers had reflectances of 32% and 34% at 950 nm, respectively.

Example 3
Crucible ion-exchange Protected from Ambient Environment

Using a sealed Al crucible that was designed by David Funk for the purpose of electric-field assisted ion exchange using liquid nitrate contacts on both sides of the wafer, indications of defect-free glass after ion exchange were observed. The was corroded around the edges where the polished Al to glass seal leaked, but was defect and corrosion free in the interior where little air was leaked into the chamber. Subsequent experiments led to sealing a crucible with a graphite gasket material that was air tight. This led to a repeatable demonstration of defect free/corrosion free ion exchange in NIST-1 (IOG-1) phosphate glasses.

While the process has not completely eliminated corrosion of the glass in the region of the waveguides, the remaining corrosion is mitigated and uniform and also rinses away in the etching material used to etch the Al mask from the samples.

Example 4

An array of monolithic, single-frequency distributed-Bragg-reflector (DBR) waveguide lasers has been successfully demonstrated operating near 1536 nm wavelengths. The lasers were fabricated by forming waveguides in Yb/Er co-doped phosphate glass by ion exchange. The slope efficiency for each laser as a function of launched pump power is 26% and the thresholds occur at 50 mW of launched pump power. An output power of 80 mW was achieved with 350 mW of coupled pump power. Each laser exhibits stable operation on a single longitudinal mode and all have linewidths less than 500 kHz. A comb of waveguides with varying effective indices allows the selection of wave length using a single-period grating.

The description is the first reported monolithic, single-frequency DBR, waveguides lasers in Yb$^{3+}$/Er$^{2+}$-co-doped phosphate glass. Over the past several years, the growth in the demand for telecommunications bandwidth generated by new telecommunications services, cable television (CATV), and data communication has drive the rapid development of wavelength division multiplexing (WDM) where information is simultaneously transmitted on several different wavelengths in the same optical fiber channel. The development of WDM systems has placed demands on laser sources that are difficult to meet using existing technologies such as semiconductor distributed feedback (DFB) lasers. Issues of concern for such systems include wavelength selectivity, wavelength stability over laser lifetime, tunability, process yield, power limitations, and costs.

Integrated, single-frequency, solid-state lasers using the Er$^{3+}$ ion offer a very promising and competitive alternative to DFB lasers for use in future WDM communications systems and for CATV. Several demonstrations of the waveguide and fiber laser technology have been discussed in the literature. One primary advantage of solid-state waveguide lasers is that they offer the possibility for arrays of lasers operating on many wavelengths on a single glass chip. Rare-earth-doped waveguide lasers can also provide kilohertz linewidths with high radiance, low noise, and easy coupling to optical fibers.

Single-transverse-mode waveguides at 1535 nm wavelength were fabricated in a commercially available phosphate alkali glass that was co-doped with 0.99×10$^{20}$ ions/cm$^3$ and 3.97×10$^{20}$ Yb$^{3+}$ ions/cm$^3$. [7,8]Phosphate glass is a very good host material for ytterbium and erbium ions since the sensitization efficiency is nearly unity and large doping concentrations are possible before the onset of concentration quenching. The guides were formed by ion exchange of K$^+$ for Na$^+$ using line apertures 3 to 8 $\mu$m wide etched in a 200 nm thick aluminum mask layer. The exchange time was 4 hours in an aluminum crucible containing molten KNO$_3$ at 375° C. Inspection of the samples using refractive near-field scanning after the ion exchange revealed that the regions of the glass surface corresponding to the location of the mask openings had become recessed by approximately 1 $\mu$m during the exchange process. The mechanism behind the etching of the glass during the exchange is currently under investigation, and it is thought that it is caused by residual water in the hygroscopic nitrate melt. The surface quality of the glass in the recessed regions, as observed using a 1000× Nomarski contrast microscope, appears identical to the original surface of the glass and apparently does not cause significant scattering losses.

The waveguide end faces were polished perpendicular to the channels. The length of the waveguides prior to the grating fabrication step was 2.2 cm. Measurements of the waveguide mode-field dimensions showed that a single transverse mode was supported in each of the waveguides. For the guide formed with the 6.5 $\mu$m mask aperture, the 1/e full-widths of the mode-field intensity were 16 $\mu$m wide by 11 $\mu$m deep at 1.54 $\mu$m wavelength. It supported multiple transverse modes at the 977 nm pump wavelength. However, when the device was lasing, the pump energy was confined primarily within the lowest-order transverse mode, which had 1/e dimensions of 13 $\mu$m wide by 9.5 $\mu$m deep. All measurements of the intensity profile are within an estimated experimental error of ±10%.

A DBR surface relief grating was fabricated holographically in a 0.5 $\mu$m thick layer of Shipley 1805 photoresist using a 90° corner that split a collimated laser beam into two beams. The corner was mounted on a rotation stage so that the angle of the two beams could be varied One surface of the corner was a mirror, and the other surface was a vacuum chuck for holding the sample. Light from a 457.8 nm Ar-ion layer was spatially filtered by focusing through a 15 $\mu$m pinhole using a 20× objective lens. The beam was collimated using a 76 mm diameter lens with a 350 mm focal length. The exposure angle was set to write a grating with a pitch of Λ=507.8 nm. For a waveguide with estimated effective index of 1.515±0.003, this pitch should provide laser operation at λ=1538.6 nm±3 nm. The exposure time for the photoresist was 18s with 3.85 nW incident in each arm of the 0.44 cm² exposed region (0.8 cm long×0.55 cm wide). The grating was developed in undiluted Shipley CD-30⁸ developer. During the development, the diffraction of light from a 632.8 nm HeNe laser as monitored. When the first-order diffracted power reached a peak, the grating was removed, rinsed, and dried.

Before the DBR grating was formed by transferring the photoresist pattern into the glass by Ar-ion sputtering, 40 nm of Cr was deposited on the surface with the specimen inclined 60° to the electron-beam evaporation source. Mounting the specimen in this way causes Cr to accumulate only on the tops of the grating lines and not in the grooves, thus providing ion etching system with a 6.67 Pa (50 mTorr) Ar-ion plasma. The low-pressure plasma created a large self-bias voltage of 1700 V when running at 365 W of coupled power with frequency 13.5 MHZ. The electrode spacing was 3.2 cm. After etching, the sample was cleaned ultrasonically in photoresist stripper at 85° C. FIG. 1 of "Rigorous Scalar Modeling of Er and Er/Yb-doped Waveguide Lasers" (Veasey, Gary, Amin) is an illustration of the completed DBR laser array.

The waveguide laser cavities were formed by placing a thin, highly reflecting (R=99.9% at 1540 nm. R=15% at 997 nm) dielectric mirror on the pump input facet. The mirror was held in place by a spring clip, and index-matching fluid was used between the mirror and the waveguide facet. The DBR grating was used as the laser output coupler. We tested the laser by coupling light from a Ti-Al$_2$O$_2$ laser turned to a wavelength of 977 nm using a 4× objective lens with a numerical aperture of 0.1. The launching efficiency was estimated to be between 65 and 71 percent. To determine the launching efficiency we measured the Fresnel reflectance of the input mirror, the loss of the launching objective, and the excess coupling loss. FIG. 10 of "Rigorous Scalar Modeling of Er and Er/Yb-doped Waveguide Lasers" (Veasey, Gary, Amin) shows the laser output power as a function of launched pump power and the spectrum of the laser. The waveguide diffusion aperture for this waveguide was 8 nm. The slope efficiency as a function of launched pump power is calculated to by 26 percent when we take the coupling factor to be 71 percent.

We estimated the reflectance of the grating using the simplified laser formula derived from the theory of Rigrod:

$$\frac{P_1}{P_2} = \frac{1-R_1}{1-R_2}\frac{R_2}{R_1}$$

where $P_1$ is the output power at the grating end and $P_2$ is the output power at the end opposite the grating. $R_1$ is the grating reflectance and $R_2$ is the reflectance of the attached mirror. We used two mirrors with reflectances of 80 and 90 percent for $R_2$. For both cases, we calculated the grating reflectances, $R_1$, to be 65 percent.

To investigate the longitudinal mode structure of the laser we coupled the laser output into an optical fiber scanning Fabry-Perot interferometer with a free spectral range of 124 GHz. FIG. 11 of "Rigorous Scalar Modeling of Er and Er/Yb-doped Waveguide Lasers" (Veasey, Gary, Amin) shows that the laser operated on a single longitudinal mode when the coupled pump power did not exceed 300 mW. The laser was robustly single frequency with TE polarization, and no mode hopping was observed. The inset in FIG. 11 shows that a second longitudinal mode appeared when coupled pump power exceeded 300 mW. In this pump regime, the laser was unstable and exhibited mode hopping, single-frequency operation, and dual-frequency operations. By measuring the frequency spacing between the longitudinal modes we determined that the physical length of the laser cavity was 1.4 cm.

We measured the linewidth of the laser using a conventional self-heterodyne configuration with a 75 MHZ frequency shift. The path length difference between the two arms was 10 km corresponding to linewidth resolution limit of 30 kHz for a gaussian line shape. Optical isolations were used in both arms to prevent optical linewidth narrowing due to feedback; however, the output end of the laser was not beveled. FIG. 12 of "Rigorous Scalar Modeling of Er and Er/Yb-doped Waveguide Lasers" (Veasey, Gary, Amin) shows the self-heterodyne spectrum. The laser linewidth we obtained from this measurement was 500 kHz.

Finally, we measured the laser wavelengths of other waveguides on the chip using an automatic spectrum analyzer with a resolution of 0.1 nm. Seven of the eleven waveguides on the chip exhibited laser oscillation. The waveguides formed through the smaller apertures did not achieve threshold because the smaller mode volumes caused a reduction of the gain such that the 45 percent transmittance loss of grating could not be overcome. FIG. A5 in "Arrays of Distributed-Bragg-Refractor Waveguide Lasers at 1536 nm in YB/ER-co-doped Phosphate Glass" (Veasey, Funk, Sanford, Hayden) shows the change in wavelength trend as we scanned the waveguides. The wavelength increases as the diffusion aperture width increases, which is consistent with increasing effective index as the aperture width increases.

This example has demonstrated an array of high power, robustly single-frequency, integrated, DBR waveguide lasers operating near 1536 nm wavelength. The slope efficiencies of the lasers are 26 percent based on launched pump power, and the threshold is less than 50 mW when pumped at a wavelength of 977 nm. The linewidths of the lasers were measured to be 500 kHz, and the outputs were linearly polarized in a TE mode. We are currently investigating the temperature stability of the lasers and the relative intensity noise (RIN). We expect that with diode laser pumping, the RIN will be similar to other results presented for single-fluency fiber lasers and will fall below −150 db/Hz above 10 MHZ. We anticipate that the output power and efficiency will increase and the threshold power will decrease when the grating reflectance is increased. This is possible with only minor adjustments to the grating fabrication process. Further improvements will also be realized by directly coating the high reflector onto the waveguide end facets. We have shown that lasers with several output wavelengths can be integrated on a single glass substrate. This example shows that stable, multi-wavelength, WDM sources with wavelengths falling on the International Telecommunications Union (ITU) grid can be realized by writing several gratings of varying period in Yb/Er-co-doped glass waveguides formed by ion exchange.

Example 5

Compact solid-state lasers based on the 1.5 µm $Er^{3+}$ transition hold promise as sources for optical fiber communication systems. $Yb^{2+}$ is commonly used as a sensitizer in $Er^{3+}$ lasers because it has a much larger absorption cross section near 980 nm than $Er^{3+}$, and it efficiently transfers its excited state energy to the upper level of the $Er^{3+}$ laser. The $Er^{3+}$/Yb3+ glass waveguide laser, in particular, has several advantages over lasers in $Er^{3+}$-doped or $Er^{3+}$/$Yb^{3+}$-co-doped glass fiber and bulk crystalline or glass hosts. Ion-exchanged waveguides can be fabricated in glasses with large ytterbium concentrations (~5–15%) which allows the devices to be substantially shorter than fiber lasers. This results in lower polarization and output power noise, caused by thermal and mechanical stress-induced birefringence, and a smaller device volume. Short (~1–2 cm) laser cavities are also of interest because of the potential for realizing high-pulse-repetition rate (GHz), passively mode-locked lasers. Unlike bulk devices, waveguide lasers can be designed to operate in a single transverse mode independent of the operating power or pump laser transverse mode profile, and to not require the alignment of bulk mirrors. In addition, the mode field sizes in waveguides can be designed to closely match those of optical fiber for efficient coupling with fiber optic systems. One disadvantage of $Er^{3+}/Yb^{3+}$ glass wavelength lasers, up to this point, has been the relatively low output powers (up to a few milliwatts) available from these devices. Increased output power will greatly expand the utility of these devices. This paper describes a cw $Er^{3+}/Yb^{3+}$-co-doped phosphate glass waveguide laser which has produced 168 mW of output power at around 1540 nm for 611 mW of launched pump power at 979 nm.

Waveguides were fabricated in a commercially available phosphate glass. The glass was co-doped with 1.15 wt % $Er_2O_3$ ($0.99 \times 10^{20}$ ions/cm$^3$) and 4.73 wt % $Yb_2O_3$ ($3.97 \times 10^{20}$ ions/cm$^3$). Waveguides were formed by $K^+$–$Na^+$ exchange through a 200 mm thick Al mask layer with channel apertures ranging from 3 to 8 $\mu$m in width. The exchange occurred in a $KNO_2$ melt at 375° C. for 4 hours in an Al crucible. The laser results reported here are for a 6.5 $\mu$m wide mask aperture. Inspection of the samples after the ion exchange process revealed that the regions of the glass surface corresponding to the location of the mask openings had become recessed by one or two microns during the exchange process. The widths of the etched channels were close to the widths of the mask apertures and uniform in width and depth.

In another embodiment, the refractive index as a function of position within the exchanged sample was analyzed using a refractive near-field scanning method. FIG. B1 in "170 mW eb at 1540 nm from an Erbium/Ytterbium Co-doped Glass Waveguide Laser" (Funk, Veasey, Peters, Sanford, Hayden) shows the index depth profile at the center of the waveguide formed with the 6.5 $\mu$m mask aperture for a wavelength of 633 nm. This method allows the relative position and absolute index values to be determined with an accuracy of 0.7 $\mu$m and 0.001, respectively.

In another embodiment, the transverse modes of the waveguides were characterized by coupling light at the wavelength of interest into one end of the waveguides and imaging the light emerging from the other end onto a calibrated infrared camera. The uncertainty of the mode dimensions determined using this method are ~10%. The device supported a single transverse mode at 1.54 $\mu$m having dimensions of 14.5 $\mu$m wide by 7.5 $\mu$m deep (measured at the 1/e points). The waveguide supported multiple transverse modes at 980 nm. However, when the device was lasing, the pump energy was confined primarily within the lower order transverse mode which had dimensions of 6.4 $\mu$m wide by 3.6 $\mu$m deep.

In another embodiment, the device was pumped with a $Ti^3$ sapphire laser. The waveguide laser cavities were formed by placing thin dielectric mirrors on the polished waveguide end faces. The mirrors were held in place by small spring clips, and index matching oil was used between the mirror and waveguide end faces to reduce losses. The pump laser was launched through one of the mirrors with a 4× microscope objective. The laser output and unabsorbed pump were collimated with a 16× microscope objective and separated using filters. The laser cavity was 20 mm in length. The mirror through which the pump was launched had reflectivities of >99.9% and 15% at 1536 and 980 nm, respectively. The output coupler had a reflectivity of 80% at 1536 nm and transmitted 85% of the incident pump power. Neither the waveguide length nor the cavity output coupling has been optimized. The launching efficiency was estimated to $\leq 71\%$, including losses due to the transmission of the input mirror and launching objective. The laser output power characteristics for two different pump wavelengths are illustrated in FIG. B2 of "170 mW eb at 1540 nm from an Erbium/Ytterbium Co-doped Glass Waveguide Laser" (Funk, Veasey, Peters, Sanford, Hayden). When pumped at 979 nm, the launched pump power threshold was 51 mW. A maximum output power of 168 mW was obtained for 611 mW of launched 979 nm pump power. A lower threshold could be obtained by turning the pump laser off of the $Yb^{3-}$ absorption peak. For a pump wavelength of 960 nm, the threshold was 23 mW. The slope efficiency for both pump wavelengths was ~28%.

Using the broad-band cavity described above, the $Er^{3+}/Yb^{3+}$ laser usually operated at several wavelengths simultaneously. A typical laser spectrum showing simultaneous operation at 1536.0, 1540.7 and 1544.8 nm is depicted in FIG. B3 of "170 mW at 1540 nm from an Erbium/Ytterbium Co-doped Glass Waveguide Laser" (Funk, Veasey, Peters, Sanford, Hayden). The wavelength(s) of operation could be shifted by passing some of the collimated 1.5 $\mu$m laser output through a prism and reflecting it back through the prism and into the waveguide using a dielectric mirror. This formed a weakly-coupled, external cavity. By rotating the prism, it was possible to produce wavelengths ranging from 1536 to 1595 nm.

A common feature of many three-level rare-earth lasers is sustained relaxation oscillations which can caused by small fluctuations in the pump laser power. Fluctuations in output power at frequencies ranging from ~0.5 to 1.5 MHZ were observed in this laser. The amplitude of the fluctuations decreased with pump power. FIG. B4 in "170 mW eb at 1540 nm from an Erbium/Ytterbium Co-doped Glass Waveguide Laser" (Funk, Veasey, Peters, Sanford, Hayden) shows the output as a function of time for pump power levels just above threshold and 9.4 times threshold. At the low pump power, the output power fluctuations of ~30% (peak to peak) of the average power were observed. At the high pump power, the fluctuations decreased to ~5% (peak to peak) of the average power. The $T^{3+}$ sapphire pump laser exhibited output power fluctuations of ~2–3%. Using a diode laser as the pump source should result in much quieter operation of the $Er^{3+}$ laser.

Output powers exceeding 160 mW at 1.5 $\mu$m are now available from glass waveguide lasers fabricated using a simple thermal ion exchange process. Improvements in the waveguide fabrication process to optimize the waveguide geometry (such as incorporating a field assisted ion exchange and fabricated buried waveguides), as well as adjustments in the cavity length and coupling, should improve the performance of these devices.

Example 6

Waveguide lasers and amplifiers in glasses codoped with $Er^{3+}$ and $Yb^{3-}$ are promising candidates for compact multifunctional devices operating near 1.5 µm. The large gain bandwidth resulting from the inhomogeneously broadened glass host makes these devices ideal for narrow-line sources useful in wavelength division multiplexing applications. In addition, due to the short cavity lengths, these waveguide lasers offer the possibility of high repetition rate (GHz) mode-locked lasers using semiconductor saturable absorbers. Such lasers would be ideal as sources for soliton communications systems. Other applications requiring an eye-safe wavelength, such as remote sensing and range finding could benefit from compact, high power cw or Q-switched waveguide laser sources based on these materials. Additionally, optical amplifiers offering gain in the range 1530 to 1550 nm may be realized.

It is known that the $Er^{3+}$ concentration must be kept relatively low (~1 wt %) in these devices in order to reduce the deleterious effects of cooperative upconversion. However, the concentration of sensitizing $Yb^{3+}$ is not limited due to any ion-ion interaction, and is expected to have a significant effect on device performance. Various authors have investigated this problem theoretically. This example reports experimental results for waveguide lasers fabricated by $K^+$–$Na^+$ ion exchange in silicate glasses with $Yb^{3+}$:$Er^{3+}$ ratios of 3:1, 5:1, and 8:1. In addition, we show how it is possible to increase the signal mode volume and optimize the pump-signal overlap through judicious choice of host material and ion exchange processing parameters. The result is an $Er^{3+}/Yb^{3+}$ waveguide laser producing as much as 19.6 mW at 1.54 µm with 398 mW of launched pump power at 974.5 nm.

The devices were fabricated in a commercially available laser glass. The glass is a phosphorus-free, mixed-alkali, zinc-silicate glass. Nominally, all three glasses were doped with 1 wt % $Er_2O_3$ ($0.85 \times 10^{20}$ $cm^{-3}$) and the glasses designated NIST10A, NIST10C, and NIST10E contain $Er^{3+}$:$Yb^{3+}$ ratios of 3:1 ($2.47 \times 10^{20}$ $Yb^{3-}$ ions $cm^{-3}$), 5:1 ($4.16 \times 10^{20}$ $cm^{-3}$), and 8:1 ($6.83 \times 10^{20}$ $cm^{-3}$), respectively. The results reported were obtained by ion exchange through 3 µm apertures in 150 nm thick Al mask layers. The ion exchange was carried out in a melt of 100% $KNO_3$ for 14 hours at 400° C.

The optical modes of the waveguides at the signal wavelength were evaluated by coupling at 1.5 µm LED into a waveguide while the output was imaged onto an infrared camera. The waveguides supported a single transverse mode of dimensions 20.5±2.1 µm wide by 11.5±1.2 µm deep (measured at the 1/e points) at the signal wavelength. Since the host glass is a mixed alkali glass which contains potassium, the introduction of additional potassium by the ion exchange process leads to a very small index change. As a result, the optical mode is not tightly confined. Although the waveguides supported multiple transverse modes at the pump wavelength, an examination of the pump mode while the device was lasing showed that only the lowest-order mode was excited. The result is excellent overlap between the pump and signal modes. The pump mode measured 15.2±1.5 µm wide by 7.0±0.7 µm deep.

Waveguide losses were estimated at 860 nm, away from the broad $Yb^{3+}$ absorption peak. Cutback measurements performed on samples prepared identically to the laser sample indicated an average waveguide loss of 0.25±0.11 dB/cm for NIST10A, 0.32±0.08 dB/cm for NIST10C, and 0.66±0.12 dB/cm for NIST10E. The coupling efficiency for the pump light was determined by measuring the pump throughput at 860 nm and correcting for losses from the input and output optics, as well as waveguide loss using the above reported loss Figures. Coupling efficiencies typically fell between 50% and 70%. The coupling efficiency was assumed to be identical at 860 nm and 975 nm.

For laser characterization, dielectric mirrors were attached to the polished end facets of the waveguide laser sample with index matching fluid and held in place by a small clip. The input mirror had a reflectance at 1536 nm of 99.9% and a transmittance at the pump wavelength of >90%. Various output couplers with reflectances ranging from 60 to 98% were used. All output couplers were also transmissive at the pump wavelength. The waveguide devices were pumped by a Ti:sapphire laser operating at 974.5 nm, which is the peak of the $Yb^{3+}$ absorption spectrum in this glass host. Pump light was coupled into the waveguide with a 4× (0.10 NA) microscope objective, and the output signal light was collected by a 20× objective. For signal power measurements, the output from the waveguide was focused onto an InGaAs power meter.

The laser performance was investigated as a function of device length as well as output coupler reflectance. FIG. C1 in "Ion-exchanged Er3+/YB3+ Glass Waveguide Lasers in Silicate Glasses" (Peters, Veasey, Funk, Sanford, Houde-Walter, Hayden) shows a plot of laser signal power vs. launched pump power for two different output couplers, for a 1.68 cm long device fabricated in the glass with 5 $Yb^{3+}$ per $Er^{3+}$ ion. The slope efficiencies and laser thresholds were determined by fitting a line to the laser data. The lowest threshold was achieved when using a 98% reflector as output coupler. This device lased with a launched pump power threshold of approximately 59 mW. The slope efficiency of this device was 2.0% with respect to launched pump power. The highest slope efficiency was realized with a 70% reflector used as an output coupler. In this case, a slope efficiency of 6.5% was achieved with a launched pump power threshold of 86 mW. For a launched pump power of 398 mW, the laser produced 19.6 mW of output power.

A plot of slope efficiency vs. output coupler reflectance for each host glass appears in FIG. C2 of "Ion-exchanged Er3+/YB3+ Glass Waveguide Lasers in Silicate Glasses" (Peters, Veasey, Funk, Sanford, Houde-Walter, Hayden). Data for device lengths in each glass which were experimentally determined to give the highest slope efficiency are plotted. Highest slope efficiency performance in each host is also compared in Table 1.

TABLE 1

Performance data for highest slope efficiency devices fabricated in IOG10 silicate glass with different $Yb^{3+}:Er^{3+}$ dopant ratios.

| $Yb^{3+}:Er^{3+}$ | Device length (cm) | Output coupler reflectance (%) | Slope efficiency (%) | Launched pump threshold (m/W) | Output with 400 MW pump (mW) |
|---|---|---|---|---|---|
| 3:1 | 1.80 | 80 | 5.2 | 52 | 17.9 |
| 5:1 | 1.68 | 70 | 6.5 | 86 | 20.4 |
| 8:1 | 1.42 | 70 | 5.0 | 238 | 8:1 |

The experiment results indicate that the optical dopant ratio is close to 5 $Yb^{3+}$ for each $Er^{3+}$. Increasing the dopant ratio from 3:1 to 5:1 leads to an improvement in slop efficiency. Further increasing the dopant ratio to 8:1 does not improve the efficiency of the device, but does lead to a substantial penalty in pump power requirements. Recent efforts have been directed toward expanding the above results using a rigorous scalar model. In addition, alteration of the potassium content of the host glass is being investigated as a way to adjust the model value and decrease pump threshold requirements.

Figure 1:
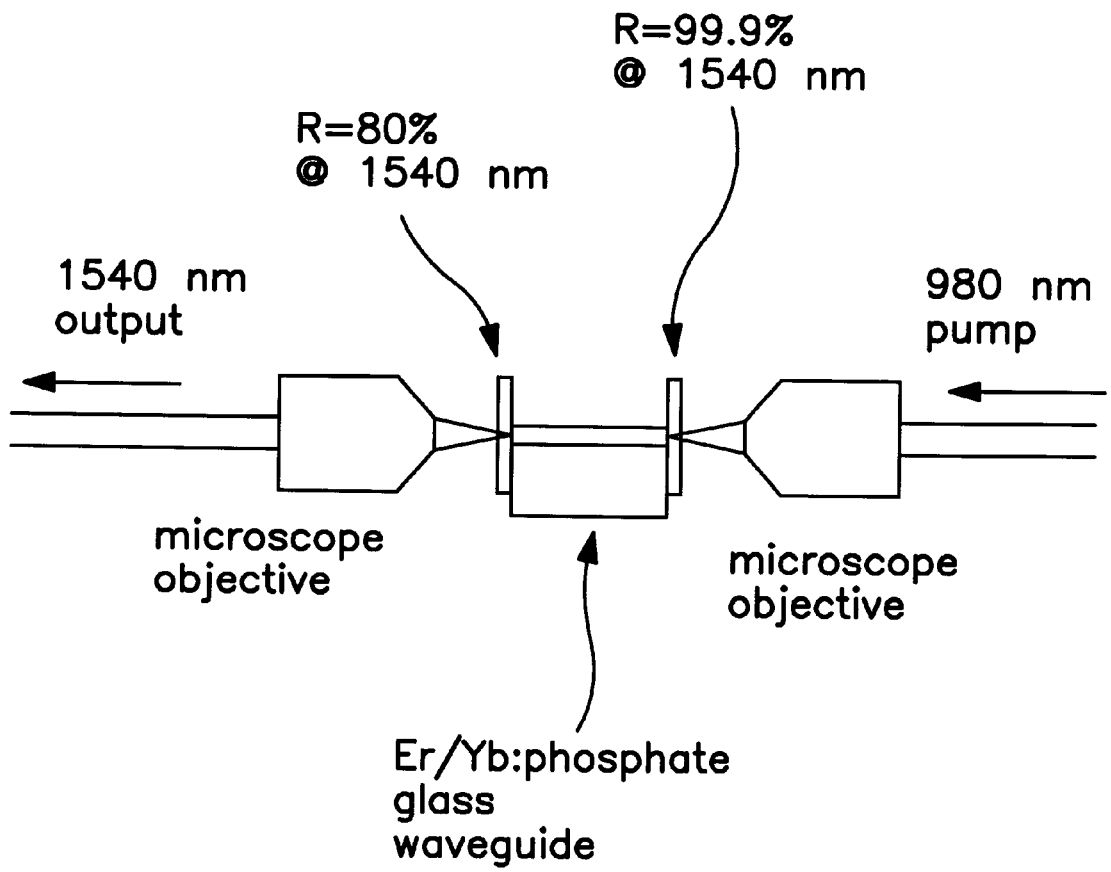
FIG. 1 shows a schematic of the laser measurement setup.
Figure 2:
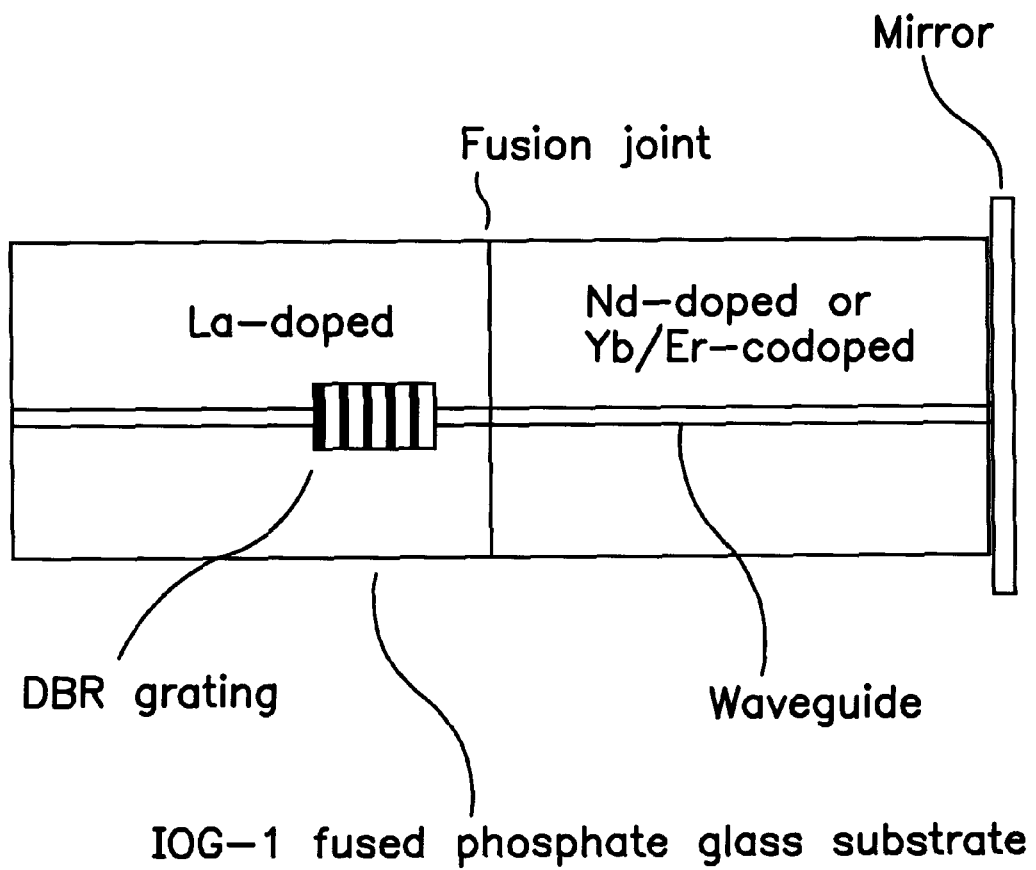
FIG. 2 shows an embodiment of the fabrication of a single-frequency 1.32–1.4 um laser in Nd-doped phosphate glass fused to La-doped glass.

We claim:

1. An optical device comprising a glass substrate doped with a laser species and having one or more waveguides defined by channels in the substrate having a distinct refractive index from the substrate wherein at least one waveguide is provided by subjecting a channel of the substrate to ion-exchange by contact with an ion-exchange solvent and varying its refractive index, wherein: (a) the ion-exchange solvent is subjected to dehydration before, during or both before and during the ion-exchange, (b) the ion-exchange is conducted under an environment excluding some or all of the atmospheric air or oxygen or (c) the ion-exchange solvent is subjected to dehydration before, during or both before and during the ion-exchange and the ion-exchange is conducted under an environment excluding some or all of the atmospheric air or oxygen.

2. The optical device of claim 1, wherein the ion-exchange is conducted by contacting the substrate with a potassium ion-containing composition through a mask defining the length and width of the channel defining the waveguide.

3. The optical device of claim 1, wherein ion-exchanged waveguides are buried below the substrate surface level by diffusing Na ions into the substrate.

4. An optical device of claim 1, wherein the substrate is comprised of an alkali phosphate glass doped with Er and Yb.

5. An optical device of claim 1 in the form of a laser capable of generating or amplifying laser light, which further comprises an inlet for light into the waveguide, an outlet for the generated or amplified laser light, one or more components for providing and pumping light into the inlet and a reflecting element in association with the waveguide to provide a laser effect when pumped.

6. The optical device of claim 5, wherein the reflecting element is a diffraction grating provided on the substrate.

7. The optical device of claim 5, wherein the reflecting element is a DBR grating provided on the substrate.

8. The optical device of claim 5, which is in the form of a laser providing a power of over 20 mW and a slope efficiency of 28% or higher.

9. The optical device of claim 8, which is in the form of a laser providing a power of 25–180 mW.

10. The optical device in the form of a laser of claim 5, which has a linewidth of 500 kHz or less.

11. The optical device of claim 1, which contains two or more waveguides.

12. The optical device of claim 1, wherein the ion-exchange solvent is subjected to dehydration by baking the solvent at a temperature of 120° C. or more in an inert atmosphere.

13. The optical device of claim 1, wherein the ion-exchange is conducted in a borosilicate crucible.

14. The optical device of claim 1, wherein the doped laser species includes one or more rare earth elements.

15. The optical device of claim 1, wherein the doped laser species includes one or more of Er, Yb, Nd, Ho, Tm, Sm, Tb, Dy or Pr.

16. The optical device of claim 1, wherein the preparation of the glass substrate from a melt includes a step of bubbling a dry, optionally reactive, gas through the melt.

17. The optical device of claim 16, wherein the gas is chlorine.

18. The optical device of claim 1, wherein the ion-exchange solvent comprises a silver salt.

19. The optical device of claim 1, wherein the ion-exchange is conducted in a sealed aluminum crucible.

20. The optical device of claim 1, wherein the ion-exchange is conducted in a silica crucible.

21. The optical device of claim 1, wherein the ion-exchange solvent is subjected to dehydration before, during or both before and during the ion-exchange.

22. The optical device of claim 1, wherein the ion-exchange is conducted under an environment excluding some or all of the atmospheric air or oxygen.

23. A method for making a waveguide comprising:
   forming a mask layer upon a surface of a glass substrate doped with Er and Yb, the mask layer having one or more apertures therein,
   exposing the substrate surface through the mask to an ion-exchange solvent, thereby forming one or more waveguides in the substrate as channels corresponding to said apertures, wherein: (a) the ion-exchange solvent is subjected to dehydration before, during or both before and during the ion-exchange, (b) the ion-exchange is conducted under an environment excluding some or all of the atmospheric air or oxygen or (c) the ion-exchange solvent is subjected to dehydration before, during or both before and during the ion-exchange and the ion-exchange is conducted under an environment excluding some or all of the atmospheric air or oxygen.

24. The method of claim 23, wherein the mask contains two or more apertures and the substrates is provided with two or more corresponding waveguides.

25. The method of claim 23, further comprising providing an inlet for light into the waveguide, an outlet for generated or amplified laser light, one or more components for providing and pumping light into the inlet and a reflecting element on the waveguide to provide a laser device capable of generating or amplifying laser light.

26. The method of claim 23, where in the substrate is comprised of an alkali phosphate glass doped with Er and Yb.

27. The method of claim 23, further comprising coating the substrate surface with a silicon oxide layer to improve adhesion of the ion-exchange solvent thereto.

28. The method of claim 23, further comprising conducting field-assisted ion exchange on the substrate.

29. The method of claim 28, wherein the field-assisted ion exchange is conducted using a solid silver electrode to provide a solid silver film.

30. The method of claim 23, wherein the ion-exchange is conducted in a borosilicate crucible.

31. The method of claim 23, further comprising preparing the glass substrate from a melt including a step of bubbling a dry, optionally reactive, gas through the melt.

32. The method of claim 31, wherein the gas contains some chlorine gas to make it reactive.

33. The method of claim 23, wherein the glass substrate and the ion-exchange solvent are isolated from ambient air during the ion-exchange.

34. The method of claim 33, wherein the ion-exchange is conducted in a fixture which permits bringing a preheated glass substrate into contact and out of contact with a preheated dry ion-exchange solvent without exposure to ambient air.

35. The method of claim 23, wherein the ion-exchange solvent comprises a silver salt.

36. The method of claim 23, wherein the ion-exchange is conducted in a sealed aluminum crucible.

37. The method of claim 23, wherein the ion-exchange is conducted in a silica crucible.

38. The method of claim 23, wherein the ion-exchange solvent is subjected to dehydration before, during or both before and during the ion-exchange.

39. The method of claim 23, wherein the ion-exchange is conducted under an environment excluding some or all of the atmospheric air or oxygen.

* * * * *